United States Patent
Lee et al.

(10) Patent No.: US 10,483,278 B2
(45) Date of Patent: *Nov. 19, 2019

(54) NONVOLATILE MEMORY DEVICES AND METHODS FORMING THE SAME

(71) Applicant: Samsung Electronics Co., Ltd., Suwon-si (KR)

(72) Inventors: Changhyun Lee, Suwon-si (KR); Byoungkeun Son, Suwon-si (KR)

(73) Assignee: SAMSUNG ELECTRONICS CO., LTD., Samsung-ro, Yeontong-gu, Suwon-si, Gyeonggi-do (KR)

( * ) Notice: Subject to any disclaimer, the term of this patent is extended or adjusted under 35 U.S.C. 154(b) by 117 days.

This patent is subject to a terminal disclaimer.

(21) Appl. No.: 15/676,011

(22) Filed: Aug. 14, 2017

(65) Prior Publication Data

US 2018/0019258 A1 Jan. 18, 2018

Related U.S. Application Data

(60) Continuation of application No. 14/682,111, filed on Apr. 9, 2015, now Pat. No. 9,754,957, which is a (Continued)

(30) Foreign Application Priority Data

Oct. 5, 2010 (KR) .................. 10-2010-0096991

(51) Int. Cl.
| | | |
|---|---|---|
| *H01L 27/11582* | (2017.01) | |
| *G11C 16/04* | (2006.01) | |
| *H01L 27/11556* | (2017.01) | |
| *H01L 21/28* | (2006.01) | |
| *H01L 23/50* | (2006.01) | |

(Continued)

(52) U.S. Cl.
CPC .... *H01L 27/11582* (2013.01); *G11C 16/0408* (2013.01); *G11C 16/0483* (2013.01); *H01L 21/28008* (2013.01); *H01L 23/50* (2013.01); *H01L 27/11556* (2013.01);
(Continued)

(58) Field of Classification Search
None
See application file for complete search history.

(56) References Cited

U.S. PATENT DOCUMENTS

| | | | |
|---|---|---|---|
| 7,652,931 | B2 | 1/2010 | Park et al. |
| 7,723,775 | B2 | 5/2010 | Hwang et al. |

(Continued)

FOREIGN PATENT DOCUMENTS

| | | |
|---|---|---|
| JP | 2005-192657 A | 7/2005 |
| JP | 2009-101326 | 1/2009 |

(Continued)

OTHER PUBLICATIONS

Examination report dated Oct. 23, 2014 from the Korean Patent Office for Korean Patent Application No. 10-2010-0096991.

*Primary Examiner* — Steven B Gauthier
(74) *Attorney, Agent, or Firm* — Muir Patent Law, PLLC

(57) ABSTRACT

Provided are nonvolatile memory devices and methods of forming the same. The nonvolatile memory device includes a plurality of word lines, a ground select line, string select line, and a dummy word line. Each of distances between the dummy word line and the ground select line and between the dummy word line and the word line is greater than a distance between a pair of the word lines adjacent to each other.

13 Claims, 43 Drawing Sheets

Related U.S. Application Data division of application No. 14/135,049, filed on Dec. 19, 2013, now Pat. No. 9,047,952, which is a division of application No. 13/243,968, filed on Sep. 23, 2011, now Pat. No. 8,625,348.

(51) Int. Cl.
  *H01L 27/11524* (2017.01)
  *H01L 27/1157* (2017.01)

(52) U.S. Cl.
  CPC ..... *H01L 27/1157* (2013.01); *H01L 27/11524* (2013.01); *H01L 2924/00* (2013.01); *H01L 2924/0002* (2013.01)

(56) References Cited

U.S. PATENT DOCUMENTS

| | | |
|---|---|---|
| 7,892,900 B2 | 2/2011 | Liu et al. |
| 8,248,853 B2 | 8/2012 | Lee et al. |
| 8,625,348 B2 | 1/2014 | Lee et al. |
| 2006/0234447 A1 | 10/2006 | Choi et al. |
| 2007/0064496 A1 | 3/2007 | Oh |
| 2007/0195610 A1 | 8/2007 | Park et al. |
| 2008/0007999 A1 | 1/2008 | Park et al. |
| 2008/0316825 A1 | 12/2008 | Hwang et al. |
| 2010/0019310 A1 | 1/2010 | Sakamoto |
| 2010/0091571 A1 | 4/2010 | Park et al. |
| 2010/0207184 A1 | 8/2010 | Kim et al. |
| 2010/0265769 A1 | 10/2010 | Hwang et al. |
| 2011/0013454 A1 | 1/2011 | Hishida et al. |
| 2011/0199825 A1 | 8/2011 | Han et al. |
| 2011/0199829 A1 | 8/2011 | Lee et al. |
| 2011/0216603 A1 | 9/2011 | Han et al. |
| 2011/0305088 A1 | 12/2011 | Huang et al. |
| 2012/0052674 A1 | 3/2012 | Lee et al. |
| 2012/0081962 A1 | 4/2012 | Tsai et al. |
| 2013/0088920 A1 | 4/2013 | Huang et al. |

FOREIGN PATENT DOCUMENTS

| | | |
|---|---|---|
| JP | 2010-034112 | 2/2010 |
| KR | 10-2006-0060528 | 6/2006 |
| KR | 10-0632652 | 9/2006 |
| KR | 10-2008-0005765 | 1/2008 |
| KR | 10-0870279 | 11/2008 |
| KR | 10-20080111921 | 12/2008 |

NONVOLATILE MEMORY DEVICES AND METHODS FORMING THE SAME

CROSS-REFERENCE TO RELATED APPLICATIONS

This patent application is a continuation of U.S. patent application Ser. No. 14/682,111 filed on Apr. 9, 2015 which is a divisional application of U.S. patent application Ser. No. 14/135,049, filed on Dec. 19, 2013, which is a divisional application of U.S. patent application Ser. No. 13/243,968 filed on Sep. 23, 2011, which claims priority under 35 U.S.C. § 119 to Korean Patent Application No. 10-2010-0096991, filed on Oct. 5, 2010, the disclosures of which are incorporated by reference herein in their entireties.

BACKGROUND

The embodiments of the present inventive concept relate to semiconductor devices and methods of forming the semiconductor devices and, more particularly, to nonvolatile memory devices and methods of forming the nonvolatile memory devices.

Generally, semiconductor memory devices may be categorized into volatile memory devices which lose data upon power-off and nonvolatile memory devices which retain data when power is lost. Flash memory devices are included in the nonvolatile memory devices. The flash memory devices are highly integrated devices which include erasable programmable read only memories (EPROMs) and electrically erasable programmable read only memories (EEPROMs). The flash memory devices may be classified into a NOR type and a NAND type. The NAND type flash memory devices are formed in strings and have higher density integration as compared to NOR type flash memory devices.

SUMMARY

Embodiments of the inventive concept may provide nonvolatile memory device with improved operation characteristics and methods of forming the same.

According to an embodiment, a nonvolatile memory device may include a plurality of word lines on a semiconductor substrate, a ground select line at a side of the word lines, a string select line at another side of the word lines, a first dummy word line between the ground select line and a first word line, wherein the first word line is nearest to the ground select line among the word lines, and a second dummy word line between the string select line and a second word line, wherein the second word line is nearest to the string select line among the word lines. Each of a first distance between the ground select line and the first dummy word line and a second distance between the first dummy word line and the first word line may be greater than a third distance between a pair of the word lines adjacent to each other.

According to an embodiment, each of a distance between the string select line and the second dummy word line and a distance between the second dummy word line and the second word line may be greater than the third distance.

According to an embodiment, a channel region of the ground select line and a channel region of the first dummy word line may have the same conductivity type as a conductivity type of the semiconductor substrate between the ground select line and the first dummy word line.

According to an embodiment, a source/drain region may be induced in the semiconductor substrate between the channel regions of the ground select line and the first dummy word line by a fringe field.

According to an embodiment, a channel region of the string select line and a channel region of the second dummy word line may have the same conductivity type as a conductivity type of the semiconductor substrate between the string select line and the second dummy word line.

According to an embodiment, channel regions of the word lines may have the same conductivity type as a conductivity type of the semiconductor substrate between the channel regions of the word lines.

According to an embodiment, a nonvolatile memory device may include gate patterns and insulating patterns alternately and repeatedly stacked on a semiconductor substrate, semiconductor patterns penetrating the gate patterns and the insulating patterns, and upwardly extending from the semiconductor substrate, and a data storage layer disposed between the semiconductor patterns and the gate patterns. The gate patterns may include a plurality of word lines, a ground select line under the word lines, a string select line on the word lines, a first dummy word line between the ground select line and a first word line, wherein the first word line is nearest to the ground select line among the word lines, and a second dummy word line between the string select line and a second word line, wherein the second word line is nearest to the string select line among the word lines. Each of a first distance between the ground select line and the first dummy word line and a second distance between the first dummy word line and the first word line may be greater than a third distance between a pair of the word lines adjacent to each other.

According to an embodiment, a thickness of each of insulating patterns between the ground select line and the first dummy word line and between the first dummy word line and the first word line may be greater than a thickness of each of insulating patterns between the word lines.

According to an embodiment, each of a distance between the string select line and the second dummy word line and a distance between the second dummy word line and the second word line may be greater than the third distance.

According to an embodiment, a thickness of each of insulating patterns between the string select line and the second dummy word line and between the second dummy word line and the second word line may be greater than a thickness of each of the insulating patterns between the word lines.

According to an embodiment, the data storage layer may include a charge trapping layer having charge trap sites.

According to an embodiment, the data storage layer may extend onto top surfaces and bottom surfaces of the gate patterns.

According to an embodiment, a method of forming a nonvolatile memory device may include alternately and repeatedly forming gate patterns and insulating patterns on a semiconductor substrate, forming semiconductor patterns which penetrate the gate patterns and the insulating patterns and upwardly extend from the semiconductor substrate, and forming a data storage layer between the semiconductor patterns and the gate patterns. The gate patterns may include a plurality of word lines, a ground select line under the word lines, a string select line on the word lines, a first dummy word line between the ground select line and a first word line, wherein the first word line is nearest to the ground select line among the word lines, and a second dummy word line between the string select line and a second word line, wherein the second word line is nearest to the string select line among the word lines. Each of a first distance between the ground select line and the first dummy word line and a second distance between the first dummy word line and the first word line may be greater than a third distance between a pair of the word lines adjacent to each other.

According to an embodiment, each of a distance between the string select line and the second dummy word line and a distance between the second dummy word line and the second word line may be greater than the third distance.

According to an embodiment, forming the gate patterns and the insulating patterns may include alternately and repeatedly forming first insulating layers and second insulating layers on the semiconductor substrate.

According to an embodiment, the first, second and third distances may be proportional to thicknesses of the first insulating layers.

According to an embodiment, forming the gate patterns and the insulating patterns may further include forming a separation region penetrating the first insulating layers and the second insulating layers, and selectively removing the second insulating layers exposed by the separation region and forming undercut regions exposing the semiconductor patterns between the first insulating layers.

According to an embodiment, the undercut regions may be filled with the gate patterns.

According to an embodiment, forming the gate patterns and the insulating patterns may include alternately and repeatedly forming insulating layers and conductive layers on the semiconductor substrate.

According to an embodiment, the first, second and third distances may be determined by thicknesses of the insulating layers.

According to an embodiment, a memory device comprises a ground select line, a first dummy word line, a second dummy word line, a plurality of word lines including first and second word lines respectively adjacent to the first and second dummy word lines, and a string select line, wherein the lines are arranged in an order of the ground select line, the first dummy word line, the first word line, the second word line, the second dummy word line, and the string select line and wherein a distance between the ground select line and the first dummy word line or between the string select line and the second dummy word line and a distance between the first dummy word line and the first word line or between the second dummy word line and the second word line are greater than a third distance between a pair of the word lines adjacent to each other.

BRIEF DESCRIPTION OF THE DRAWINGS

The embodiments of the inventive concept will become more apparent in view of the attached drawings and accompanying detailed description.

DETAILED DESCRIPTION OF THE EMBODIMENTS

The embodiments of the inventive concept will now be described more fully hereinafter with reference to the accompanying drawings, in which. It will be understood that when an element is referred to as being "connected" or "coupled" to another element, it may be directly connected or coupled to the other element or intervening elements may be present.

It will be understood that when an element such as a layer, region or substrate is referred to as being "on" another element, it can be directly on the other element or intervening elements may be present.

Figure 1:
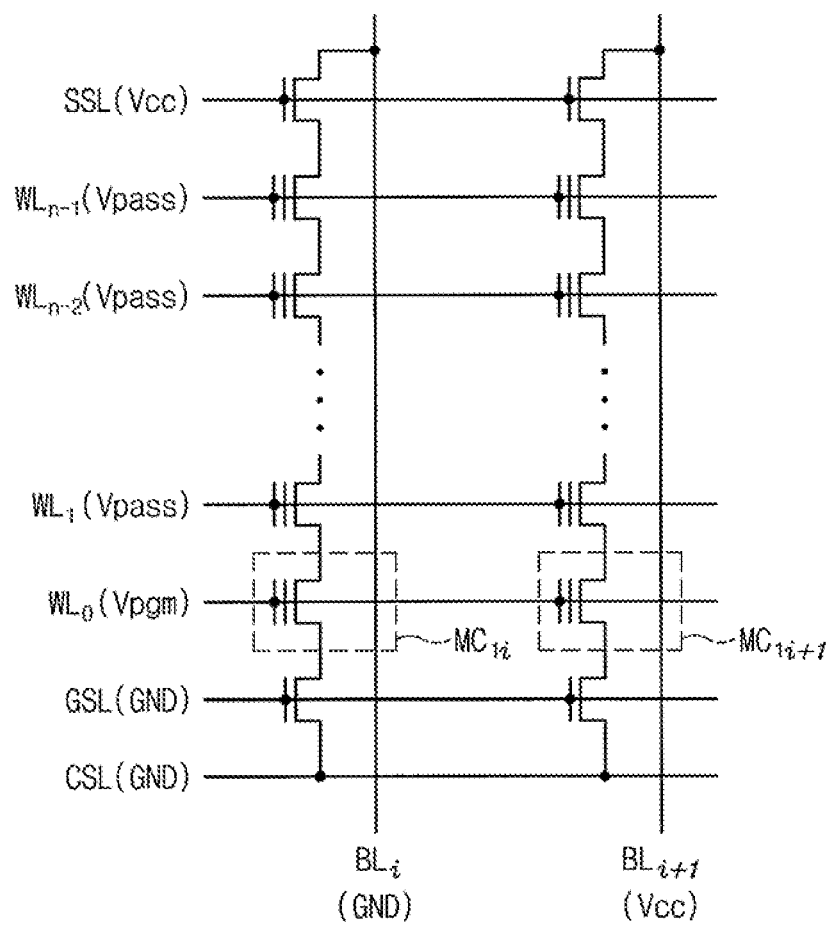
FIG. 1 is a circuit diagram to describe program disturbance of a two dimensional nonvolatile memory device.

FIG. 1 is a circuit diagram to describe program disturbance of a two dimensional nonvolatile memory device.

Referring to FIG. 1, a cell array of a NAND type flash memory device may include a string select line SSL and a ground select line GSL. Word lines $WL_0$ to $WL_{n-1}$ may be arranged between the string select line SSL and the ground select line GSL. Each of the string select line SSL, the ground select line GSL, and the word lines $WL_0$ to $WL_{n-1}$ may include a data storage layer and a control gate. Program voltage conditions of a memory cell $MC_{1i}$ selected in the NAND type flash memory device are illustrated in FIG. 1. A ground voltage GND may be applied to a selected bit line $BL_i$, a power voltage Vcc may be applied to a non-selected bit line $BL_{i+1}$, and the power voltage Vcc may be applied to the string select line SSL. The ground voltage GND may be applied to the ground select line GSL, and the ground voltage GND may be applied to a common source line CSL. A program voltage Vpgm may be applied to a selected word line $WL_0$, and a pass voltage Vpass may be applied to non-selected word lines $WL_1$ to $WL_{n-1}$. The ground voltage may be applied to a substrate.

A memory cell $Mc_{1i+1}$, connected to the selected word line $WL_0$ and the non-selected bit line $BL_{i+1}$ is prevented from being programmed. Thus, a channel voltage of the memory cell $Mc1_{i+1}$ connected to the selected word line $WL_0$ and the non-selected bit line $BL_{i+1}$ may be boosted to a high level.

Due to a potential difference between a channel region of the ground select line GSL and the channel region boosted to the high level, a strong electric field may be generated in a source/drain region between the ground select line GSL and the word line $WL_0$ adjacent to the ground select line GSL. Thus, electron-hole pairs may be generated. Holes of the electron-hole pairs may be moved toward the substrate by a substrate bias, and electrons may become hot electrons by a laterally strong electric field generated from a channel voltage of the ground select line GSL and a channel voltage of the selected word line $WL_0$. The hot electrons may be scattered at the selected word line $WL_0$ and injected into the data storage layer. This phenomenon may occur between the string select line SSL and the word line $WL_{n-1}$ adjacent to the string select line SSL. Thus, a program disturbance phenomenon may occur. The program disturbance phenomenon means that a program-inhibited cell is programmed.

Figure 2:
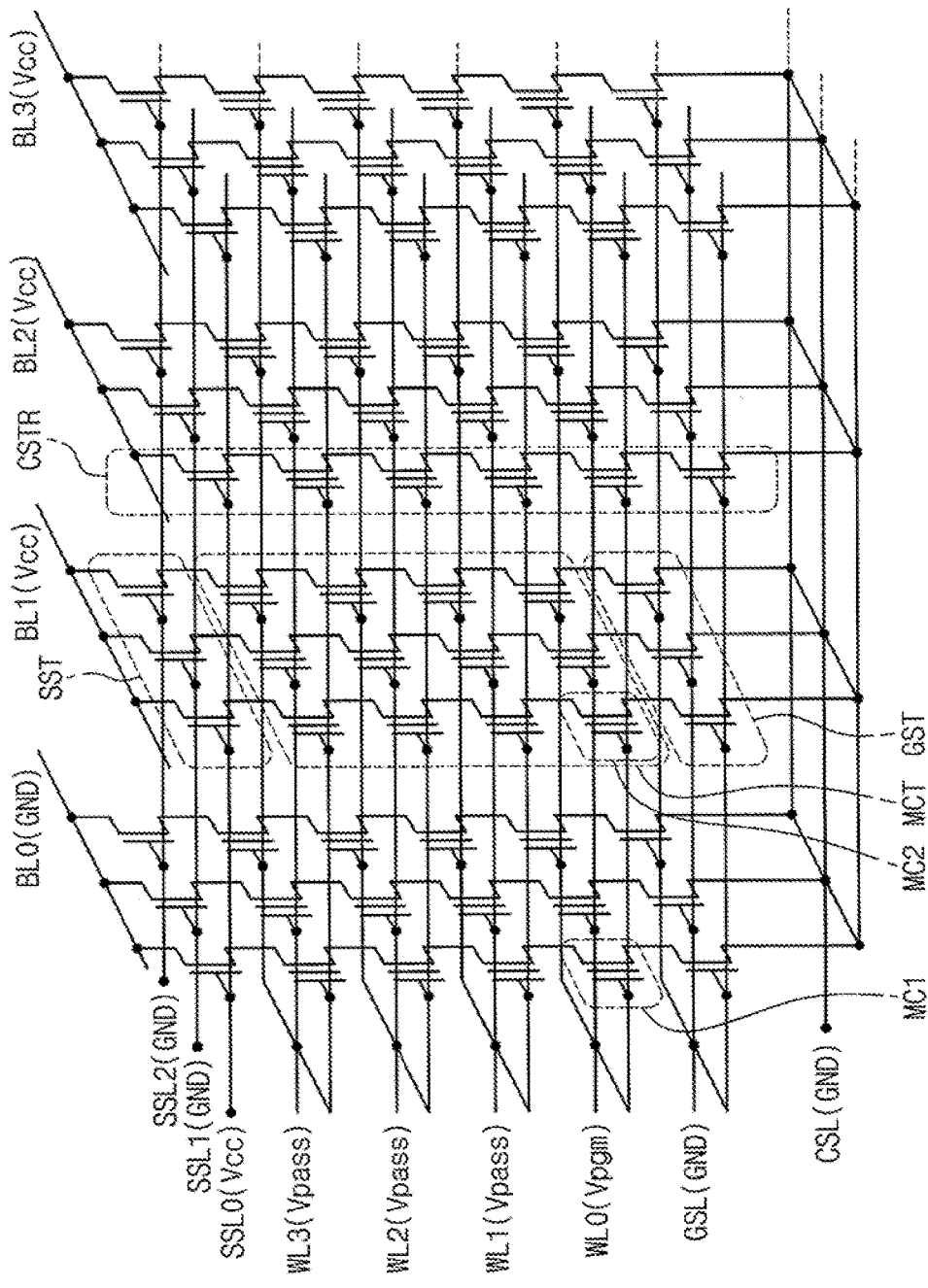
FIG. 2 is a circuit diagram to describe program disturbance of a three dimensional memory device.

FIG. 2 is a circuit diagram to describe program disturbance of a three dimensional memory device.

Referring to FIG. 2, a three dimensional device may include a common source line CSL, a plurality of bit lines BL0, BL1, BL2, and BL3, and a plurality of cell strings CSTR disposed between the common source line CSL and the bit lines BL0 to BL3.

The common source line CSL may be a conductive layer disposed on a semiconductor substrate or an impurity region formed in the semiconductor substrate. The bit lines BL0 to BL3 may be conductive patterns (e.g. metal lines) which are spaced apart from the semiconductor substrate over a top surface of the semiconductor substrate. The bit lines BL0 to BL3 may be two dimensionally arranged, and a plurality of cell strings CSTR may be connected to each of the bit lines BL0 to BL3 in parallel. Thus, the cell strings CSTR may be two dimensionally arranged on the common source line CSL or the semiconductor substrate.

Each of the cell strings CSTR may include a ground select transistor GST connected to the common source line CSL, a string select transistor SST connected to each of the bit lines BL0 to BL3, and a plurality of memory cell transistors MCT disposed between the ground and string select transistors GST and SST. The ground select transistor GST, the memory cell transistors MCT, and the string select transistor SST may be connected to each other in series. A ground select line GSL, a plurality of word lines WL0 to WL3, and a plurality of string select lines SSL, which are disposed between the common source line CSL and the bit lines BL0 to BL3, may be used as gate electrodes of the ground select transistors GST, the memory cell transistors MCT, and the string select transistors SST, respectively.

The ground select transistors GST may be disposed at substantially the same distance from the semiconductor substrate, and gate electrodes of the ground select transistors GST may be jointly connected to the ground select line GSL to be in an equipotential state. The ground select line GSL may be a conductive pattern having a plate shape or a comb shape which is disposed between the common source line CSL and the memory cell transistor MCT adjacent to the common source line CSL. Similarly, gate electrodes of a plurality of the memory cell transistors MCT which are disposed at substantially the same distance from the common source line CSL may also be jointly connected to one of the word lines WL0 to WL3 to be in an equipotential state. Each of the word lines WL0 to WL3 may be a conductive pattern having a plate shape or a comb shape parallel to a top surface of the substrate. Since one cell string CSTR may consist of a plurality of the memory cell transistors MCT which are disposed at different distances from the common source line CSL, multi-layered word lines WL0 to WL3 may be disposed between the common source line CSL and the bit lines BL0 to BL3.

Each of the cell strings CSTR may include a semiconductor pillar which vertically extends from the common source line CSL and is connected to a corresponding bit line of the bit lines BL0 to BL3. The semiconductor pillars may be formed to penetrate the ground select line GSL and the word lines WL0 to WL3. Each of the semiconductor pillars may include a body portion and an impurity region formed at one end or both ends of the body portions. For example, a drain region may be formed at a top end of the semiconductor pillar.

A data storage layer may be disposed between the word lines WL0 to WL3 and the semiconductor pillar. According to an embodiment, the data storage layer may be a charge storage layer. For example, the data storage layer may include one of a trap insulating layer, a floating gate electrode, or an insulating layer including conductive nano dots.

A dielectric layer used as a gate insulating layer of the ground select transistor GST or the string select transistor SST may be disposed between the ground select line GSL and the semiconductor pillar, or between the string select line SSL and the semiconductor pillar. The gate insulating layer of at least one of the ground and string select transistors GST and SST may be formed of the same material as the data storage layer of the memory cell transistor MCT or may include a gate insulating layer (e.g. a silicon oxide layer) for a general MOS field effect transistor (MOSFET).

The ground and string select transistors GST and SST and the memory cell transistors MCT may be MOS field effect transistors using the semiconductor pillar as channel regions. According to an embodiment, the semiconductor pillar may form MOS capacitors with the ground select line GSL, the word lines WL0 to WL3, and the string select lines SSL. According to an embodiment, the ground select transistor GST, the memory cell transistors MCT, and the string select transistors SST may share inversion layers formed by fringe fields of the ground select line GSL, word lines WL0 to WL3, and string select line SSL and are thus electrically connected to each other.

The program disturbance phenomenon may be caused at the three dimensional device illustrated in FIG. 2 under the same voltage conditions as described with reference to FIG. 1 by the same principle as described with reference to FIG. 1. For example, a non-selected memory cell MC2 may be programmed under program voltage conditions for a selected memory cell MC1.

Figure 3:
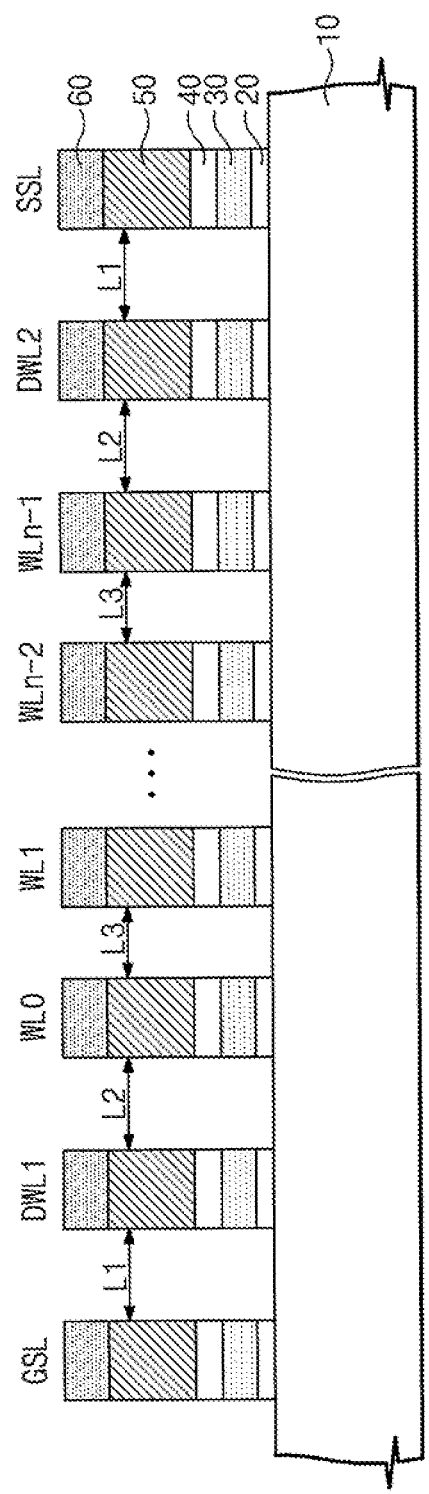
FIG. 3 is a cross sectional view illustrating a nonvolatile memory device according to an embodiment of the inventive concept.
Figure 4:
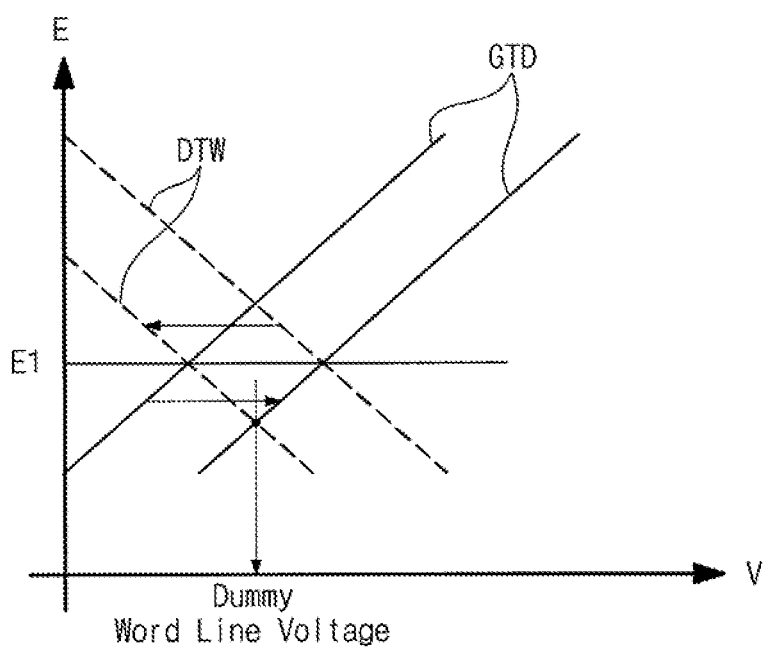
FIG. 4 is a graph illustrating program characteristics of a nonvolatile memory device according to an embodiment of the inventive concept.

FIG. 3 is a cross sectional view illustrating a nonvolatile memory device according to an embodiment of the inventive concept. FIG. 4 is a graph illustrating program characteristics of a nonvolatile memory device according to an embodiment of the inventive concept.

Referring to FIG. 3, a plurality of word lines WL0 to WLn−1 are provided on a semiconductor substrate 10. The semiconductor substrate 10 may include impurities of a first conductivity type (e.g. P-type). Each of the word lines WL0 to WLn−1 may include a tunnel insulating layer 20 on the semiconductor 10, a charge trapping layer 30 on the tunnel insulating layer 20, a blocking insulating layer 40 on the charge trapping layer 30, a control gate 50 on the blocking insulating layer 40, and a hard mask 60 on the control gate 50.

A ground select line GSL may be provided at one side of the word lines WL0 to WLn−1. A string select line SSL may be provided at another side of the word lines WL0 to WLn−1. A first dummy word line DWL1 may be disposed between the ground select line GSL and the word line WL0 which is a word line nearest to the ground select line GSL among the word lines WL0 to WLn−1. A second dummy word line DWL2 may be disposed between the string select line SSL and the word line WLn−1 which is a word line nearest to the string select line SSL among the word lines WL0 to WLn−1. The first and second dummy word lines DWL1 and DWL2 can decrease a horizontal electric field to reduce the program disturbance phenomenon.

Each of a first distance L1 between the ground select line GSL and the first dummy word line DWL1 or between the string select line SSL and the second dummy word line DWL2 and a second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

The first distance L1 may be equal to or greater than the second distance L2. According to an embodiment, the first distance L1 may be less than the second distance L2. Channel regions of the ground select line GSL and the first dummy word line DWL1 may have the same conductivity type as the semiconductor substrate 10 between the ground select line GSL and the first dummy word line DWL1. For example, a source/drain region having a conductivity type opposite to a conductivity type of the semiconductor substrate 10 may not be formed between the ground select line GSL and the first dummy word line DWL1. According to an embodiment of the inventive concept, a source/drain may be induced at the semiconductor substrate 10 between the ground select line GSL and the first dummy word line DWL1 by a fringe field.

Channel regions of the string select line SSL and the second dummy word line DWL2 may have the same conductivity type as the semiconductor substrate 10 between the string select line SSL and the second word line DWL2. Channel regions of the word lines WL0 to WLn−1 may have the same conductivity type as the semiconductor substrate 10 between the channel regions of the word lines WL0 to WLn−1. As a consequence, the string of the nonvolatile memory device according to an embodiment of the inventive concept may induce a source/drain region using the fringe field.

Referring to FIG. 4, a horizontal axis shows voltages, and a vertical axis shows electric field values in a program operation. A reference mark E1 shows an electric field applied to the word line when hot electrons are generated.

Generally, if the first distance L1 extends and the second distance L2 is equal to the third distance L3, a maximum electric field value between the ground select line GSL and the first dummy word line DWL1 may be reduced. However, when the source/drain region between the ground select line GSL and the first dummy word line DWL1 is generated by the fringe field, a cell current may be abnormally reduced. If a voltage of the first dummy word line DWL1 is reduced during the program operation, a maximum electric field between the ground select line GSL and the first dummy word line DWL1 may be reduced, but a maximum electric field between the first dummy word line DWL1 and the word line WL0 may be increased to generate hot electrons.

FIG. 4 will be described by comparing an embodiment of the inventive concept with the above case that the second distance L2 is equal to the third distance L3 and the first distance L1 is greater than each of the second and third distances L2 and L3.

Each of the first and second distances L1 and L2 greater than the third distance L3 means that the maximum electric field GTD between the ground select line GSL and the first dummy word line DWL1 increases and the maximum electric field DTW between the first dummy word line DWL1 and the word line WL0 decreases.

According to the embodiment described in connection with FIG. 3, when a voltage of the first dummy word line DWL1 is controlled, a program disturbance may be minimized or prevented, and weakening of the fringe field may be minimized.

Figure 5:
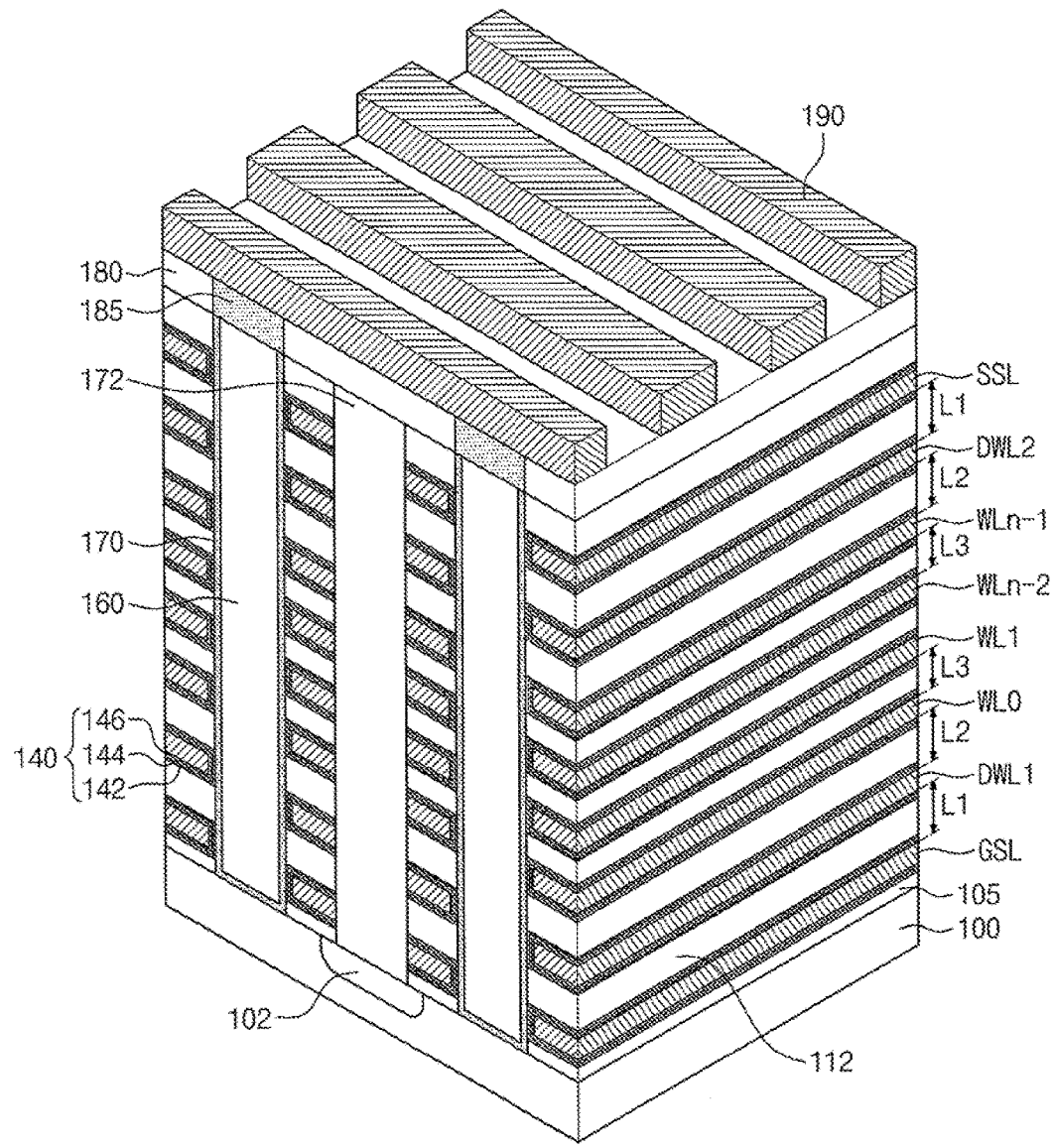
FIG. 5 is a perspective view illustrating a nonvolatile memory device according to an embodiment of the inventive concept.

FIG. 5 is a perspective view illustrating a nonvolatile memory device according to an embodiment of the inventive concept. The principle preventing the program disturbance, which has been described with reference to FIGS. 3 and 4, can apply to the nonvolatile memory device illustrated in FIG. 5.

Referring to FIG. 5, gate patterns GSL, DWL1, WL0~WLn−1, DWL2, and SSL and insulating patterns 112 may be alternately and repeatedly stacked on a semiconductor substrate 100. A buffer insulating layer 105 may be disposed between a lowermost gate pattern GSL among the gate patterns and the semiconductor substrate 100. The buffer insulating layer 105 may include a silicon oxide layer. The gate patterns GSL, DWL1, WL0~WLn−1, DWL2, and SSL may include poly silicon having conductivity and/or a metal. The insulating patterns 112 may include a silicon oxide layer.

Semiconductor patterns 170 may upwardly extend from the semiconductor substrate 100 to penetrate the gate patterns GSL, DWL1, WL0~WLn−1, DWL2, and SSL and the insulating patterns 112. The semiconductor patterns 170 may include silicon. A data storage layer 140 may be disposed between the semiconductor patterns 170 and the gate patterns GSL, DWL1, WL0~WLn−1, DWL2, and SSL. The data storage layer 140 may further be disposed on a top surface and a lower surface of each of the gate patterns GSL, DWL1, WL0~WLn−1, DWL2, and SSL. The data storage layer 140 may include a tunnel insulating layer 142, a charge trapping layer 144, and a blocking insulating layer 146. The charge trapping layer 144 may have charge trap sites. A filling layer 160 may be disposed in a through region at each of the semiconductor patterns 170.

A separation insulating layer 172 may be disposed between semiconductor patterns 170. The separation insulating layer 172 may separate the gate patterns GSL, DWL1, WL0~WLn−1, DWL2, and SSL from neighboring gate patterns. A common source region 102 may be disposed in the semiconductor substrate 100 under the separation insulating layer 172. An upper interlayer insulating layer 180 may be disposed on the semiconductor patterns 170 and the gate patterns GSL, DWL1, WL0~WLn−1, DWL2, and SSL. Contact plugs 185 may be disposed in the upper interlayer insulating layer 180 to be electrically connected to the semiconductor patterns 170, respectively. Bit lines 190 may cross the gate patterns GSL, DWL1, WL0~WLn−1, DWL2, and SSL and may be electrically connected to the contact plugs 185.

The gate patterns GSL, DWL1, WL0~WLn−1, DWL2, and SSL may include a plurality of word lines WL0 to WLn−1, a ground select line GSL under the word lines WL0 to WLn−1, a string select line SSL on the word lines WL0 to WLn−1, a first dummy word line DWL1 between the ground select line GSL and the word line WL0 which is a word line nearest to the ground select line GSL among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

A thickness of each of the insulating patterns 112 between the ground select line GSL and the first dummy word line DWL1 and between the first dummy word line DWL1 and the word line WL0 may be greater than a thickness of each of the insulating patterns 112 between the word lines WL0 to WLn−1. A thickness of each of the insulating patterns 112 between the string select line SSL and the second dummy word line DWL2 and between the second dummy word line DWL2 and the word line WLn−1 may be greater than the thickness of each of the insulating patterns 112 between the word lines WL0 to WLn−1. The first distance L1 may be equal to or greater than the second distance L2. According to an embodiment, the first distance L1 may be less than the second distance L2. The gate patterns GSL, DWL1, WL0~WLn−1, DWL2, and SSL may be close to each other to induce source/drain regions in the semiconductor patterns 170 by the fringe field. Accordingly, the program disturbance of the three dimensional nonvolatile memory device can be reduced and a cell current of the three dimensional nonvolatile memory device may be secured.

Figure 6:
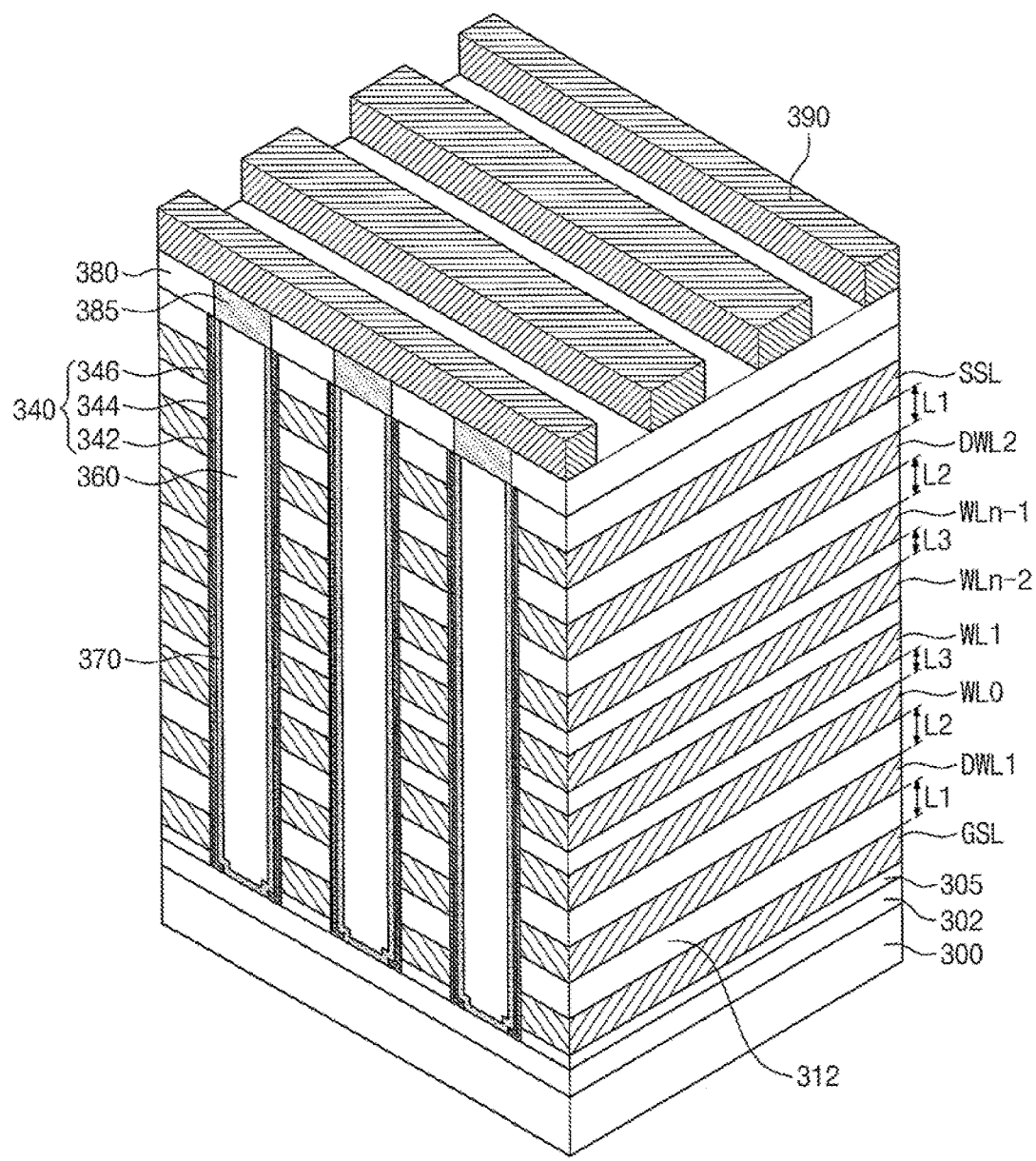
FIG. 6 is a perspective view illustrating a nonvolatile memory device according to an embodiment of the inventive concept.

FIG. 6 is a perspective view illustrating a nonvolatile memory device according to an embodiment of the inventive concept. The principle preventing the program disturbance, which is described with reference to FIGS. 3 and 4, can apply to the nonvolatile memory device illustrated in FIG. 6.

Referring to FIG. 6, gate patterns GSL, DWL1, WL0~WLn−1, DWL2, and SSL and insulating patterns 312 may be alternately and repeatedly stacked on a semiconductor substrate 300. A buffer insulating layer 305 may be disposed between a lowermost gate pattern GSL among the gate patterns GSL, DWL1, WL0~WLn−1, DWL2, and SSL and the semiconductor substrate 300. Semiconductor patterns 370 may upwardly extend from the semiconductor substrate 300 to penetrate the gate patterns GSL, DWL1, WL0~WLn−1, DWL2, and SSL and the insulating patterns 312. A data storage layer 340 may be disposed between the semiconductor patterns 370 and the gate patterns GSL, DWL1, WL0~WLn−1, DWL2, and SSL. The data storage layer 340 may extend along a sidewall of the semiconductor pattern 370. The data storage layer 340 may include a tunnel insulating layer 342, a charge trapping layer 344, and a blocking insulating layer 346. A filling layer 360 may be disposed in a through region at each of the semiconductor patterns 370.

A common source region 302 may be provided at an upper portion of the semiconductor substrate 300. An upper interlayer insulating layer 380 may be disposed on the semiconductor patterns 370 and the gate patterns GSL, DWL1, WL0~WLn−1, DWL2, and SSL. Contact plugs 385 may be disposed in the upper interlayer insulating layer 380 to be electrically connected to the semiconductor patterns 370, respectively. Bit lines 390 may cross the gate patterns GSL, DWL1, WL0~WLn−1, DWL2, and SSL and may be electrically connected to the contact plugs 385.

The gate patterns GSL, DWL1, WL0~WLn−1, DWL2, and SSL may include a plurality of word lines WL0 to WLn−1, a ground select line GSL under the word lines WL0 to WLn−1, a string select line SSL on the word lines WL0 to WLn−1, a first dummy word line DWL1, between the ground select line GSL and the word line WL0 which is a word line nearest to the ground select line GSL among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than the third distance L3 between a pair of the word lines adjacent to each other among the word lines WL0 to WLn−1.

A thickness of each of the insulating patterns 312 between the ground select line GSL and the first dummy word line DWL1 and between the first dummy word line DWL1 and the word line WL0 may be greater than a thickness of each of the insulating patterns 312 between the word lines WL0 to WLn−1. A thickness of each of the insulating patterns 312 between the string select line SSL and the second dummy word line DWL2 and between the second dummy word line DWL2 and the word line WLn−1 may be greater than the thickness of each of the insulating patterns 312 between the word lines WL0 to WLn−1. The first distance L1 may be equal to or greater than the second distance L2. According to an embodiment, the first distance L1 may be less than the second distance L2. The gate patterns GSL, DWL1, WL0~WLn−1, DWL2, and SSL may be close to each other to induce source/drain regions in the semiconductor patterns 370 by the fringe field.

FIGS. 7A to 7J are perspective views illustrating a method of forming a nonvolatile memory device according to an embodiment of the inventive concept.

Figure 7A:
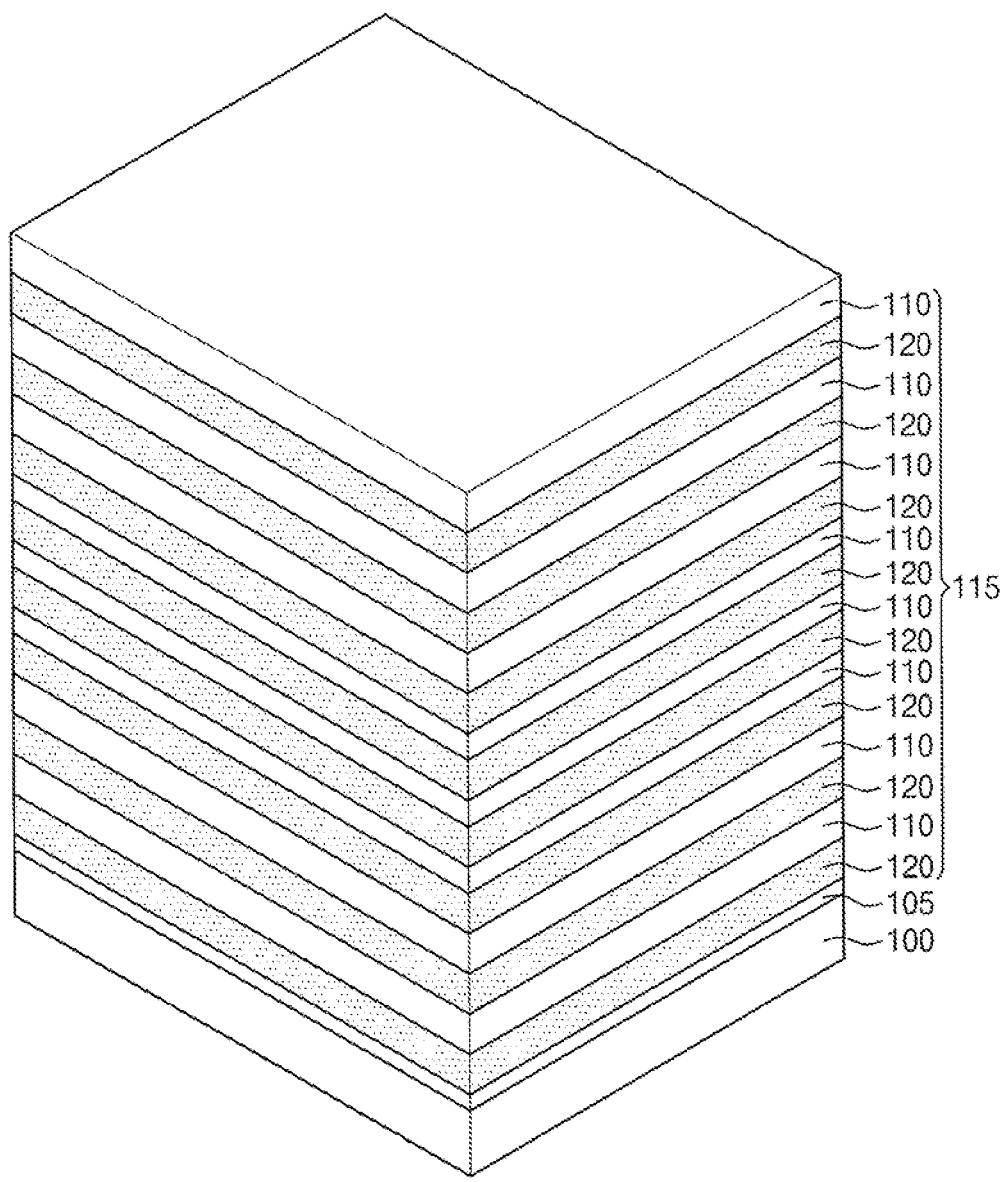
FIGS. 7A to 7J are perspective views illustrating a method of forming a nonvolatile memory device according to an embodiment of the inventive concept.

Referring to FIG. 7A, a thin layer structure 115 including a plurality of thin layers may be formed on the semiconductor substrate 100. The thin layer structure 115 may include first insulating layers 110 and second insulating layers 120 which are alternately and repeatedly stacked. For example, the thin layer structure 115 may include a plurality of the first insulating layers 110 sequentially stacked and a plurality of second insulating layers 120 interposed between the first insulating layers 110. The first insulating layers 110 may have thicknesses for satisfying the conditions as described with reference to FIG. 5. The conditions means that each of the first distance L1 between the ground select line GSL and the first dummy word line DWL1 and the second distance L2 between the first dummy word line DWL1 and the word line WL0 is greater than the third distance L3 between a pair of the word lines adjacent to each other, and each of the first distance L1 between the string select line SSL and the second dummy word line DWL2 and the second distance L2 between the second dummy word line DWL2 and the word line WLn−1 is greater than the third distance L3 between a pair of the word lines adjacent to each other.

The first insulating layers 110 may have wet etch rates different from wet etch rates of the second insulating layers 120. For example, the first insulating layers 110 may include silicon oxide layers, and the second insulating layers 120 may include silicon nitride layers. A buffer insulating layer 105 may be formed between the thin layer structure 115 and the semiconductor substrate 100. The buffer insulating layer 105 may include a silicon oxide layer.

Figure 7B:
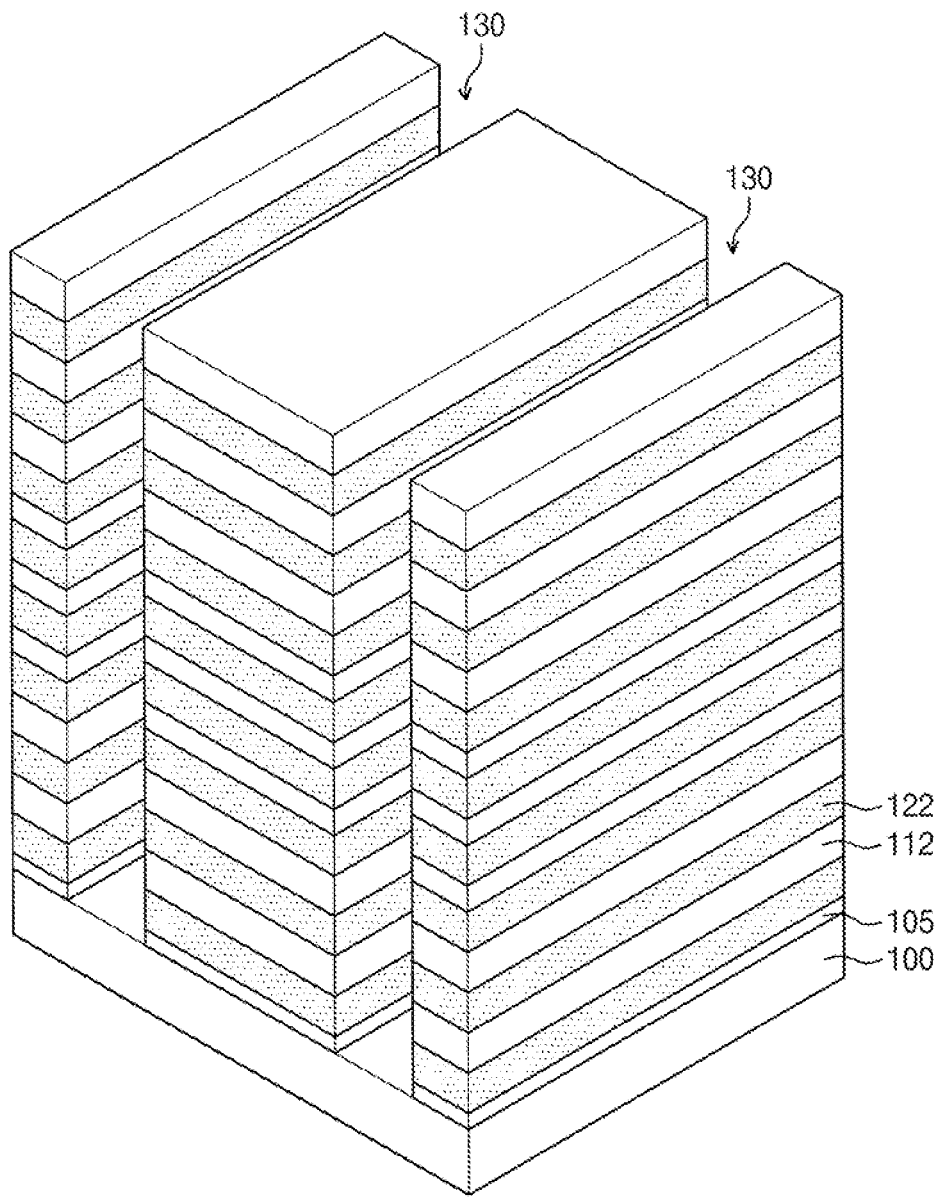

Referring to FIG. 7B, the thin layer structure 115 may be patterned to form a plurality of through regions 130 exposing a top surface of the semiconductor substrate 100. Patterning the thin layer structure 115 may include patterning the first insulating layers 110 and the second insulating layers 120 to form first insulating patterns 112 and second insulating patterns 122. In more detail, a mask pattern (not shown) defining top viewed locations of the through regions 130 may be formed on the thin layer structure 115, and then the thin layer structure 115 may be anisotropically etched using the mask pattern as an etch mask the through regions 130. The through regions 130 may be formed two dimensionally and regularly. As illustrated in FIG. 7B, the through regions 130 may be trenches which have rectangular bottom surfaces exposing the top surface of the semiconductor substrate 100.

Figure 7C:
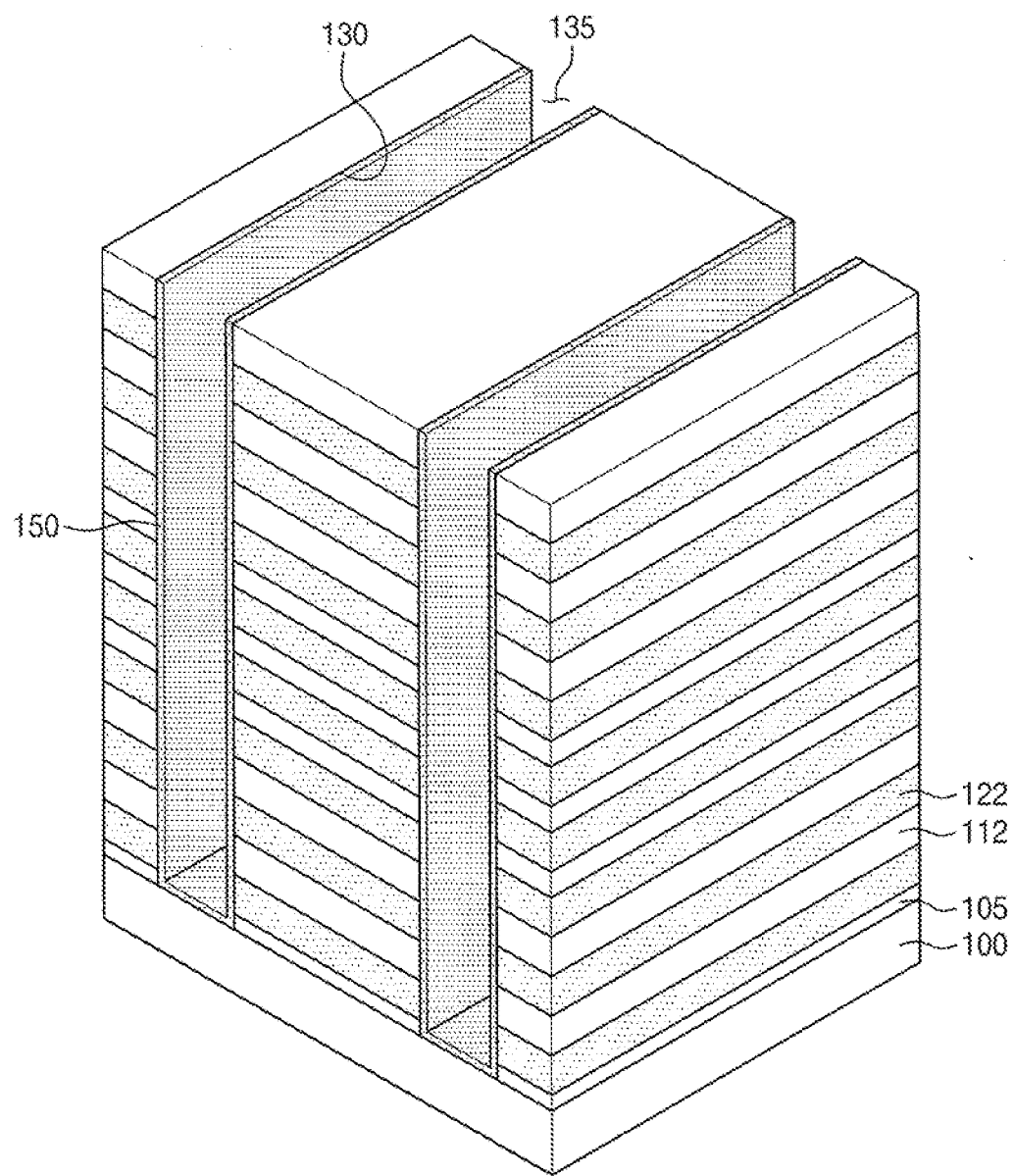

Referring to FIG. 7C, a semiconductor layer 150 may be formed to cover the through regions 130. The semiconductor layer 150 may be formed to define a gap region 135 in each of the through regions 130. The semiconductor layer 150 may be formed by a chemical vapor deposition (CVD) method.

Figure 7D:
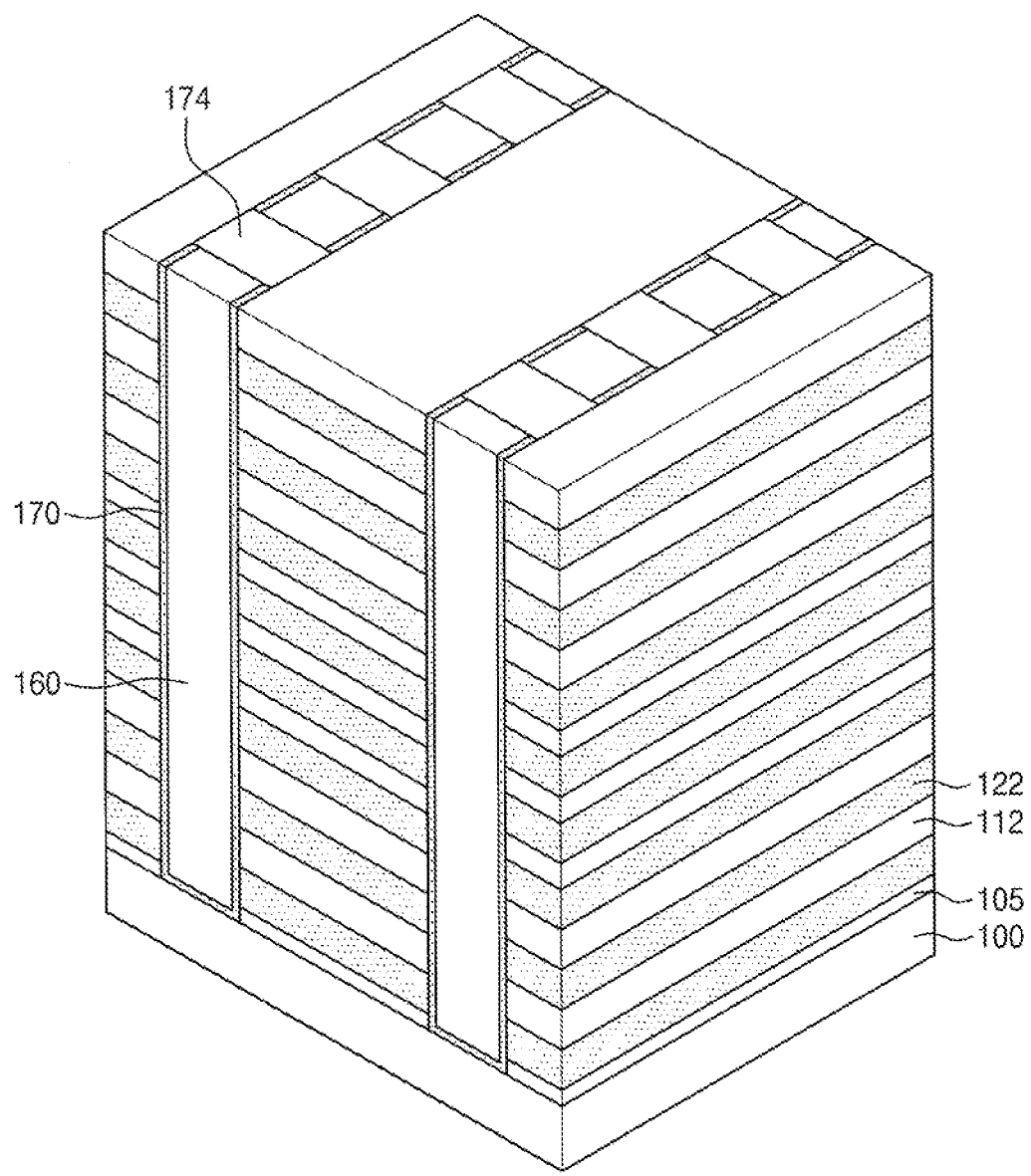

Referring to FIG. 7D, a filling layer 160 may be formed in the through region 130. The filling layer 160 may be formed to fill the gap region 135. An insulating layer filling the gap region 135 may be formed and then a planarization process may be performed on the insulating layer to form the filling layer 160. Alternatively, the semiconductor layer 150 may be formed to fill the through region 130 and the filling layer 160 may not be formed.

The semiconductor layer 150 may be patterned to form semiconductor patterns 170 upwardly extending from the semiconductor substrate 100 in the through regions 130. The semiconductor patterns 170 may extend to cross sidewalls of the first and second insulating patterns 112 and 122. The formation process of the semiconductor patterns 170 may include forming separation regions dividing the semiconductor layer 150 into the semiconductor patterns 170. The separation region may be filled with a gapfill insulating layer 174. The gapfill insulating layer 174 may include a silicon oxide layer.

Figure 7E:
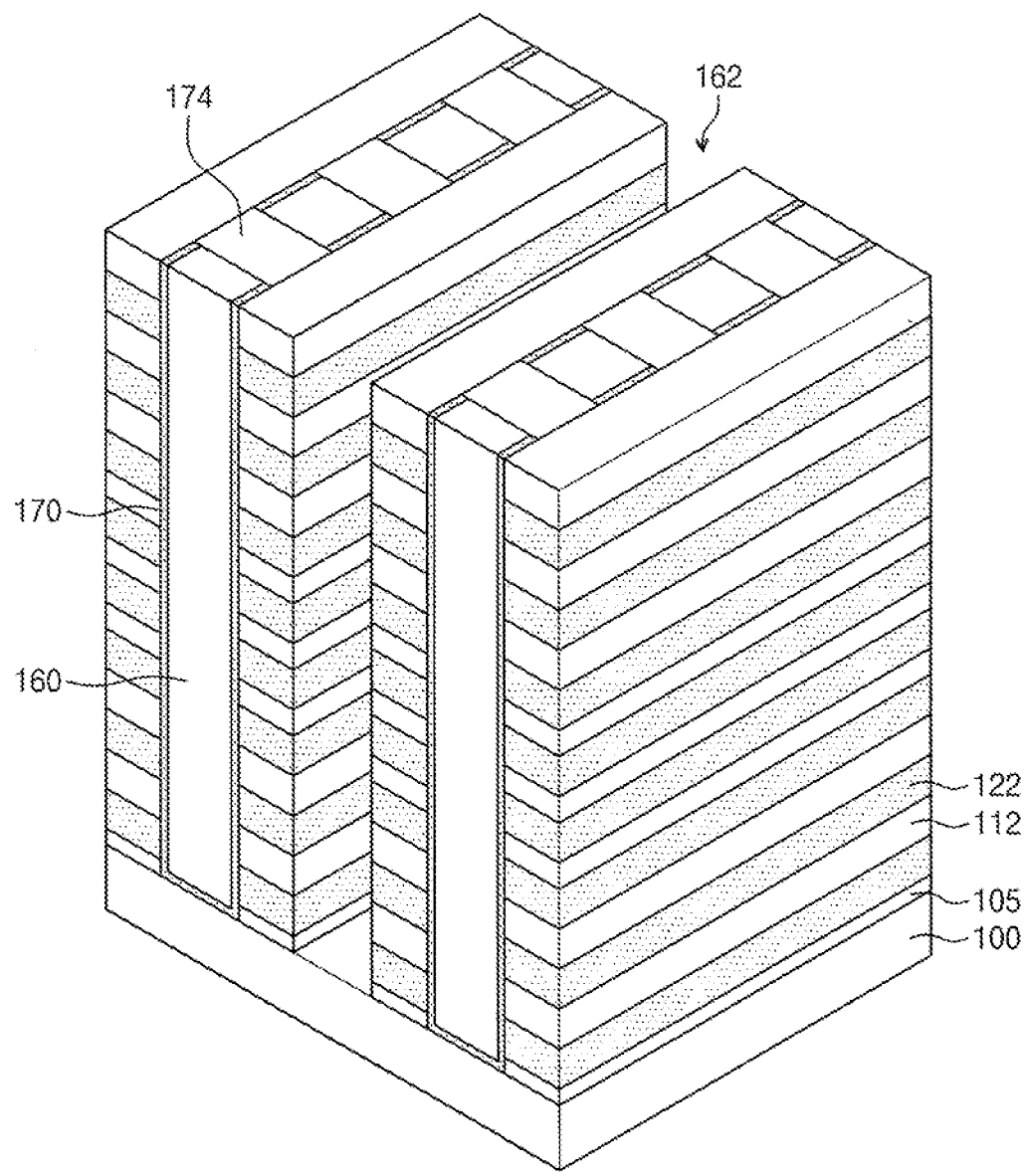
Figure 7F:
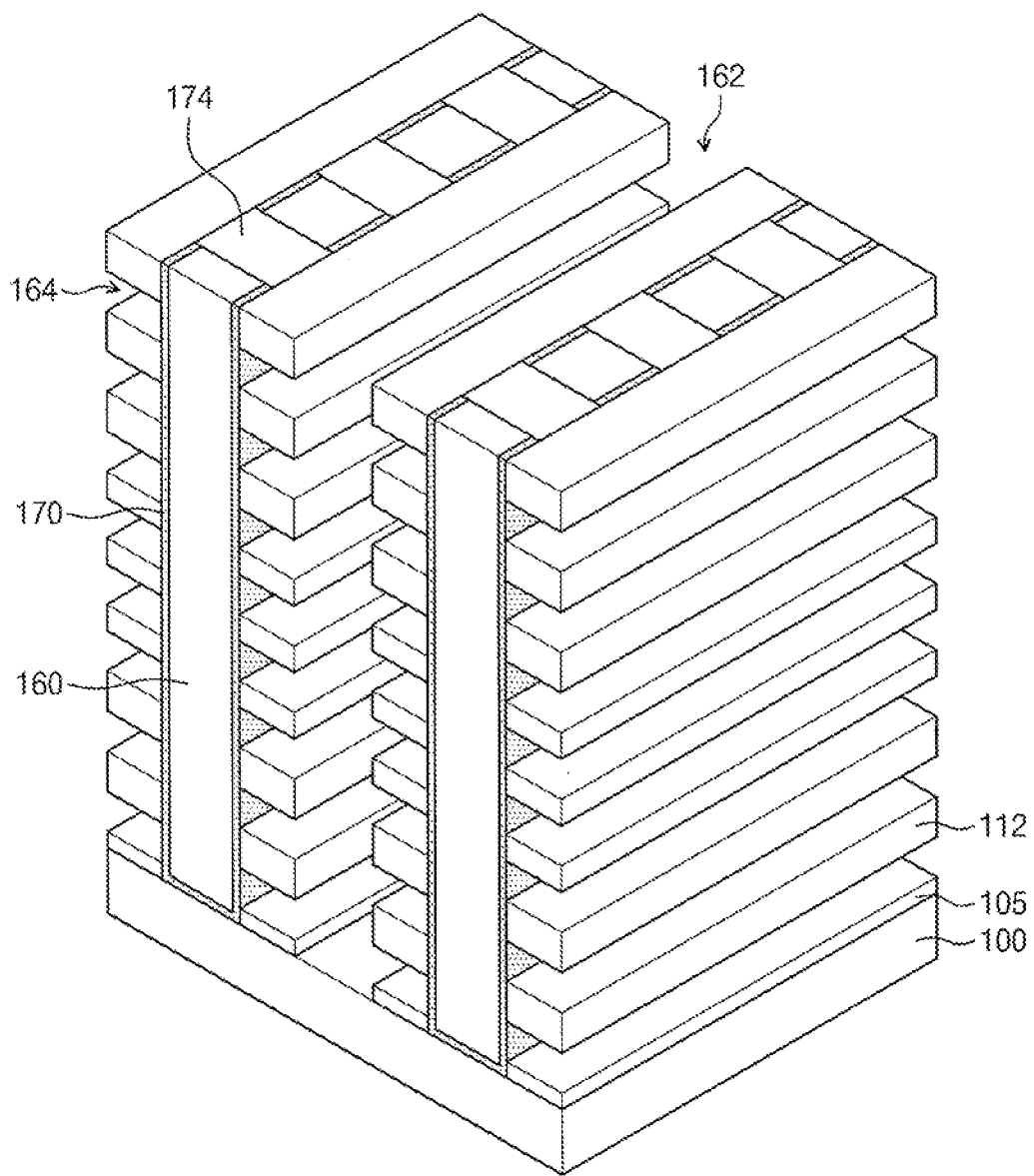

Referring to FIG. 7E, a first separation region 162 may be formed to divide the first and second patterns 112 and 122 between the through regions 130 illustrated in FIG. 7C. The first separation region 162 may expose the semiconductor substrate 100. The first separation region 162 may be formed by an anisotropic etching process. The first separation region 162 may be disposed between the filling layers 160 respectively disposed in the through regions Referring to FIG. 7F, the second insulating patterns 122 exposed by the first separation region 162 may be removed to form undercut regions 164. Since the second insulating patterns 122 are removed, the semiconductor patterns 170 between the first insulating patterns 112 may be exposed. The second insulating patterns 122 may be removed by a wet etching process. The second insulating patterns 122 may have an etch selectivity with respect to the first insulating patterns 112.

Figure 7G:
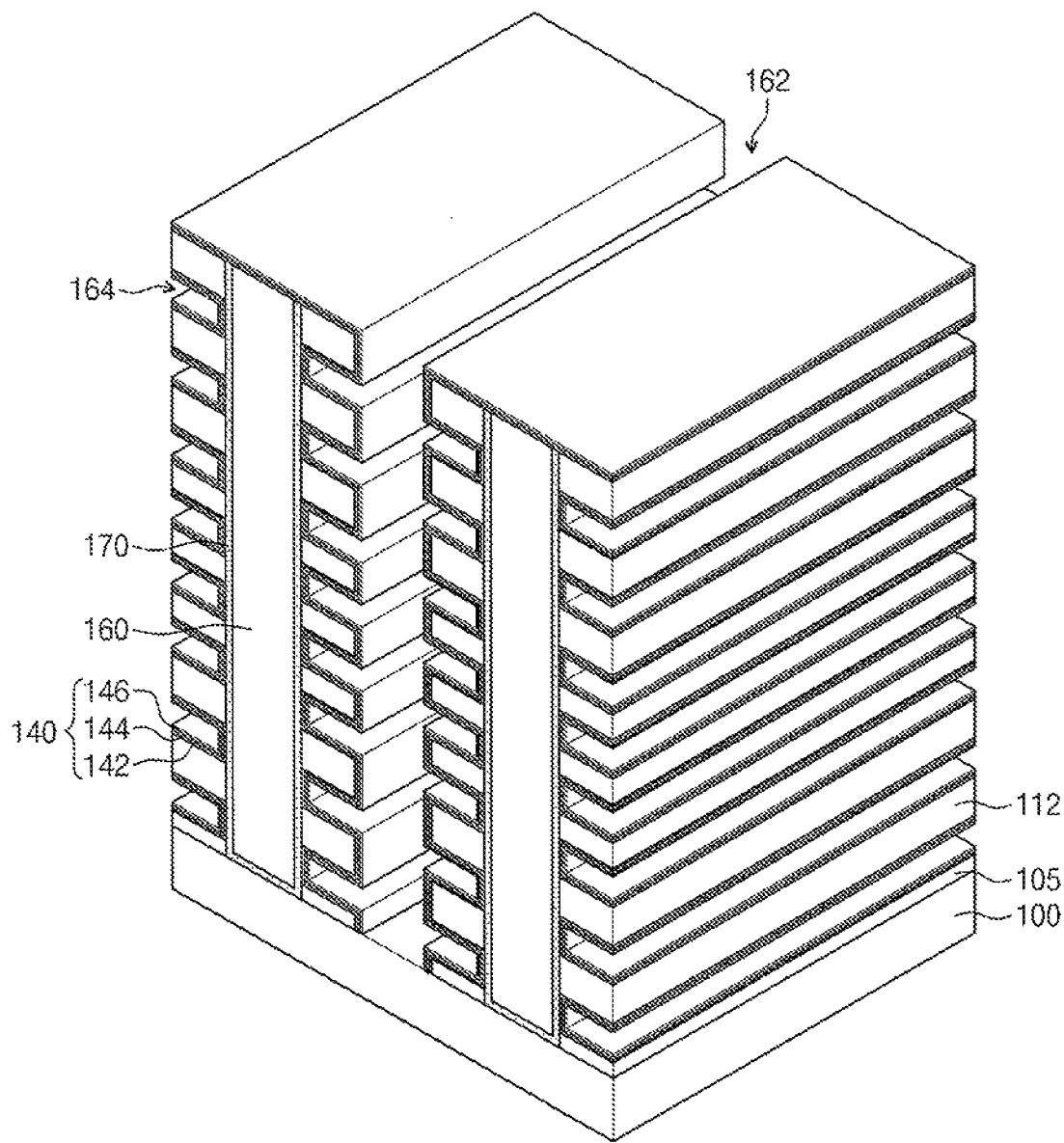

Referring to FIG. 7G, a data storage layer 140 may be formed to cover the exposed first insulating patterns 122 and semiconductor patterns 170. The data storage layer 140 may include a charge trapping layer 144 having charge trap sites. In more detail, the data storage layer 140 may include a tunnel insulating layer 142 contacting the semiconductor patterns 170, the charge trapping layer 144 on the tunnel insulating layer 142, and a blocking insulating layer 146 on the charge trapping layer 144. The charge trapping layer 144 may include a silicon nitride layer, the tunnel insulating layer 142 may include a silicon oxide layer or a multi-layer having the silicon oxide layer, and the blocking insulating layer 146 may include a high-k dielectric layer (e.g. an aluminum oxide layer or a hafnium oxide layer). The data storage layer 140 having three thin layers is illustrated in FIG. 7G. However, the embodiments of the inventive concept are not limited thereto. According to an embodiment, the data storage layer 140 may include thin layers more than three thin layers under data storing conditions.

Figure 7H:
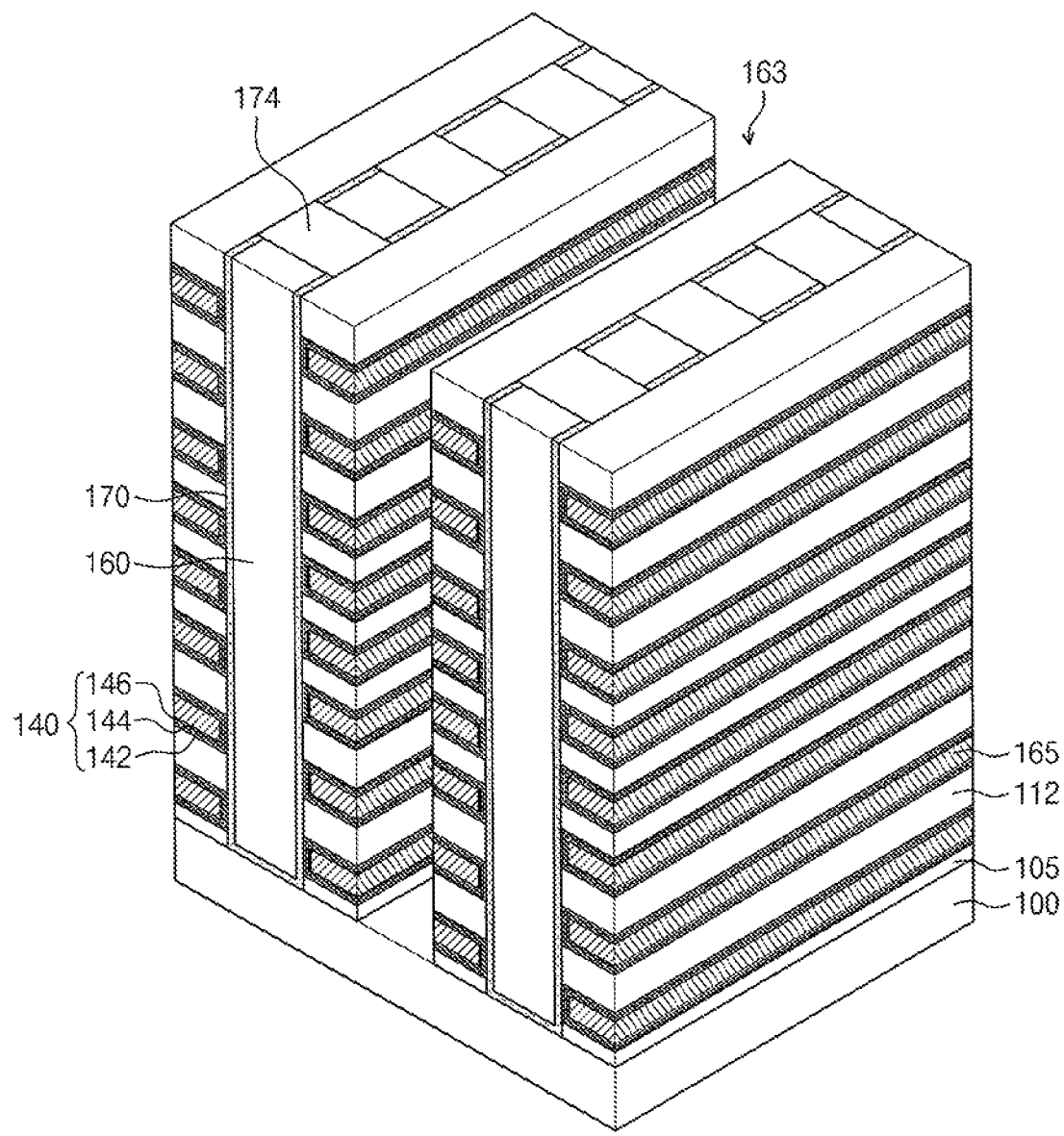

Referring to FIG. 7H, gate patterns 165 may be respectively formed in the undercut regions 164 between the first insulating patterns 112. The gate patterns 165 may be formed of poly silicon and/or metal. The gate patterns 165 may have line shapes extending in one direction. The formation process of the gate patterns 165 may include forming a gate conductive layer between the first insulating patterns 112 on which the data storage layer 140 is formed and patterning the gate conductive layer to form a second separation region 163 dividing the gate conductive layer. The second separation region 163 may be formed at the same location as a location of the first separation region 162 and may expose sidewalls of the first insulating patterns 112.

Figure 7I:
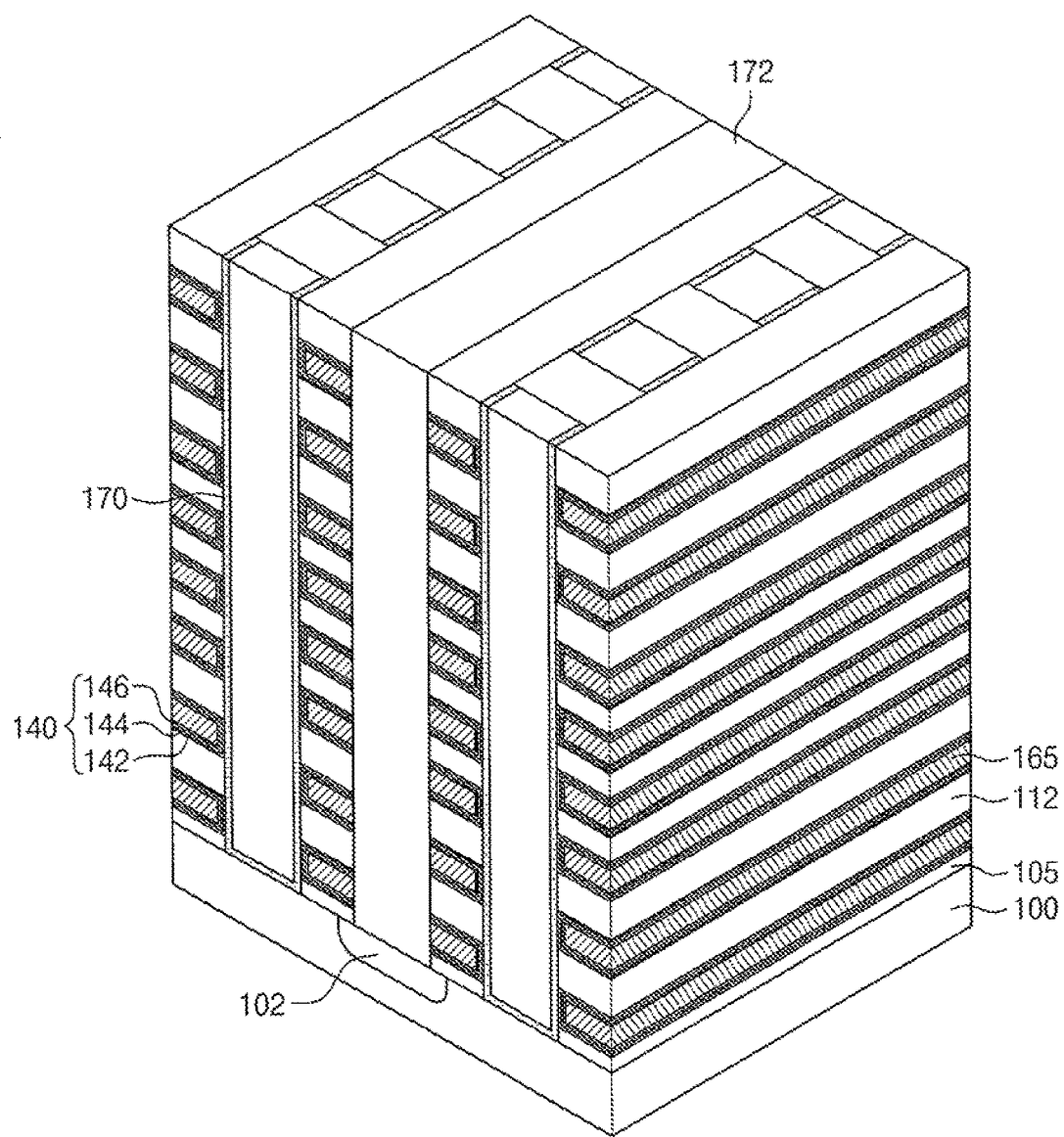

Referring to FIG. 7I, a common source region 102 may be formed in the semiconductor substrate 100 exposed by the second separation region 163. The common source region 102 may be formed by an ion implantation process. A separation insulating layer 172 filling the second separation region 163 may be formed. The separation insulating layer 172 may include a silicon oxide layer. An insulating layer filling the second separation region 163 may be formed and then a planarization process may be performed on the insulating layer to form the separation insulating layer 172.

Figure 7J:
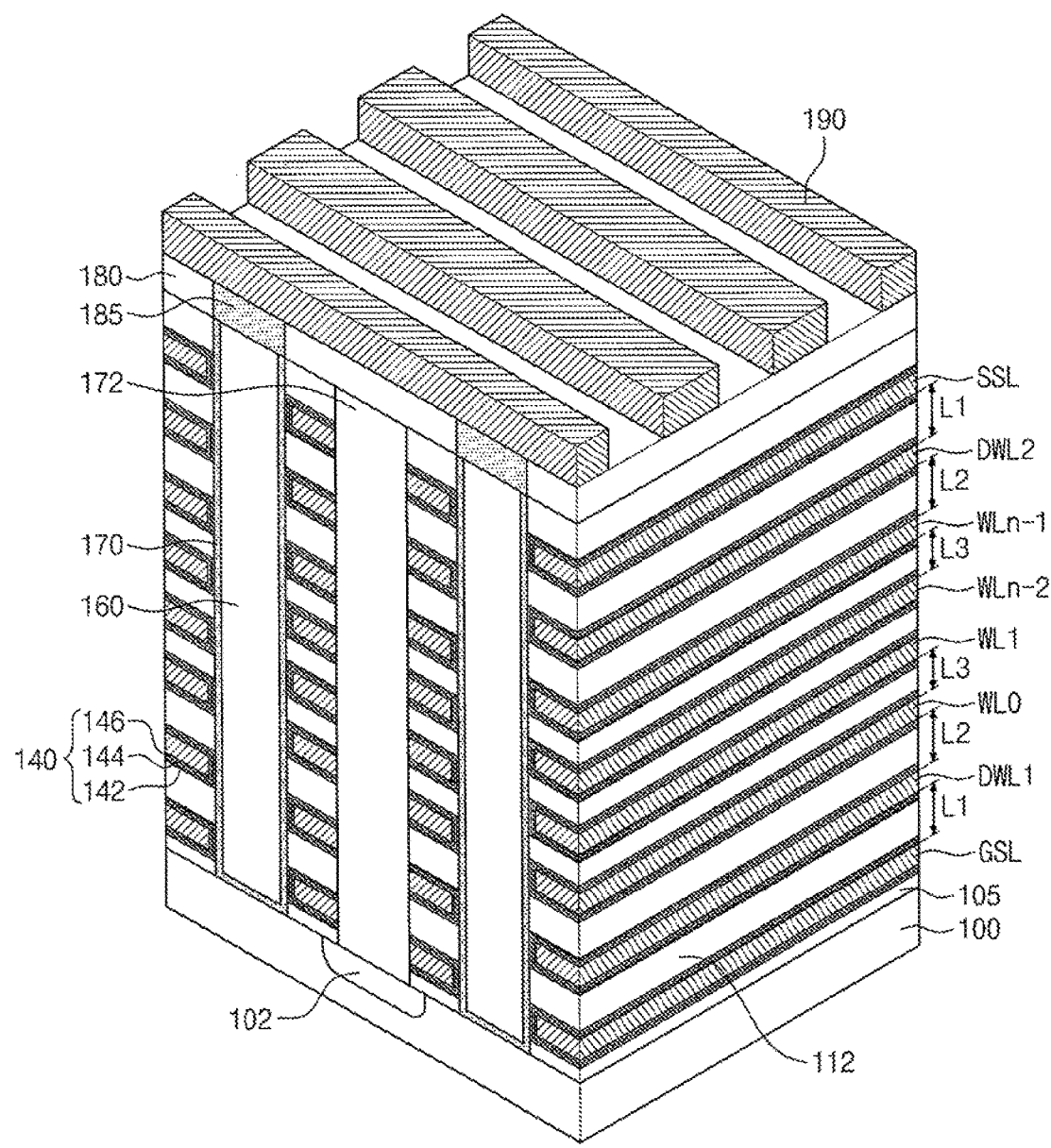

Referring to FIG. 7J, an upper interlayer insulating layer 180 may be formed on the semiconductor patterns 170 and the gate patterns. Contact plugs 185 may be formed in the upper interlayer insulating layer 180 to be electrically connected to the semiconductor patterns 170, respectively. Bit lines 190 may be formed to be electrically connected to the contact plugs 185. The bit line 190 may extend in a direction crossing a direction in which the gate pattern extends.

The gate patterns may include a plurality of word lines WL0 to WLn−1, a ground select line GSL under the word lines WL0 to WLn−1, a string select line SSL on the word lines WL0 to WLn−1, a first dummy word line DWL1 between the ground select line GSL and the word line WL0 which is a word line nearest to the ground select line GSL among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

The first distance L1, the second distance L2, and the third distance L3 may be proportional to thicknesses of the insulating patterns 112. A thickness of each of the insulating patterns 112 between the ground select line GSL and the first dummy word line DWL1 and between the first dummy word line DWL1 and the word line WL0 may be greater than a thickness of each of the insulating patterns 112 between the word lines WL0 to WLn-1. A thickness of each of the insulating patterns 112 between the string select line SSL and the second dummy word line DWL2 and between the second dummy word line DWL2 and the word line WLn-1 may be greater than a thickness of each of the insulating patterns 112 between the word lines WL0 to WLn-1. The first distance L1 may be equal to or greater than the second distance L2. Alternatively, the first distance L1 may be less than the second distance L2. The gate patterns GSL, DWL1, WL0~WLn-1, DWL2, SSL may be disposed to be adjacent to each other, so that source/drain regions may be induced in the semiconductor patterns 170 by the fringe field. As a consequence, the program disturbance of the three dimensional nonvolatile memory device can be reduced and a cell current of the three dimensional nonvolatile memory device may be secured.

FIGS. 8A to 8J are perspective views illustrating a method of forming a nonvolatile memory device according to an embodiment of the inventive concept.

Figure 8A:
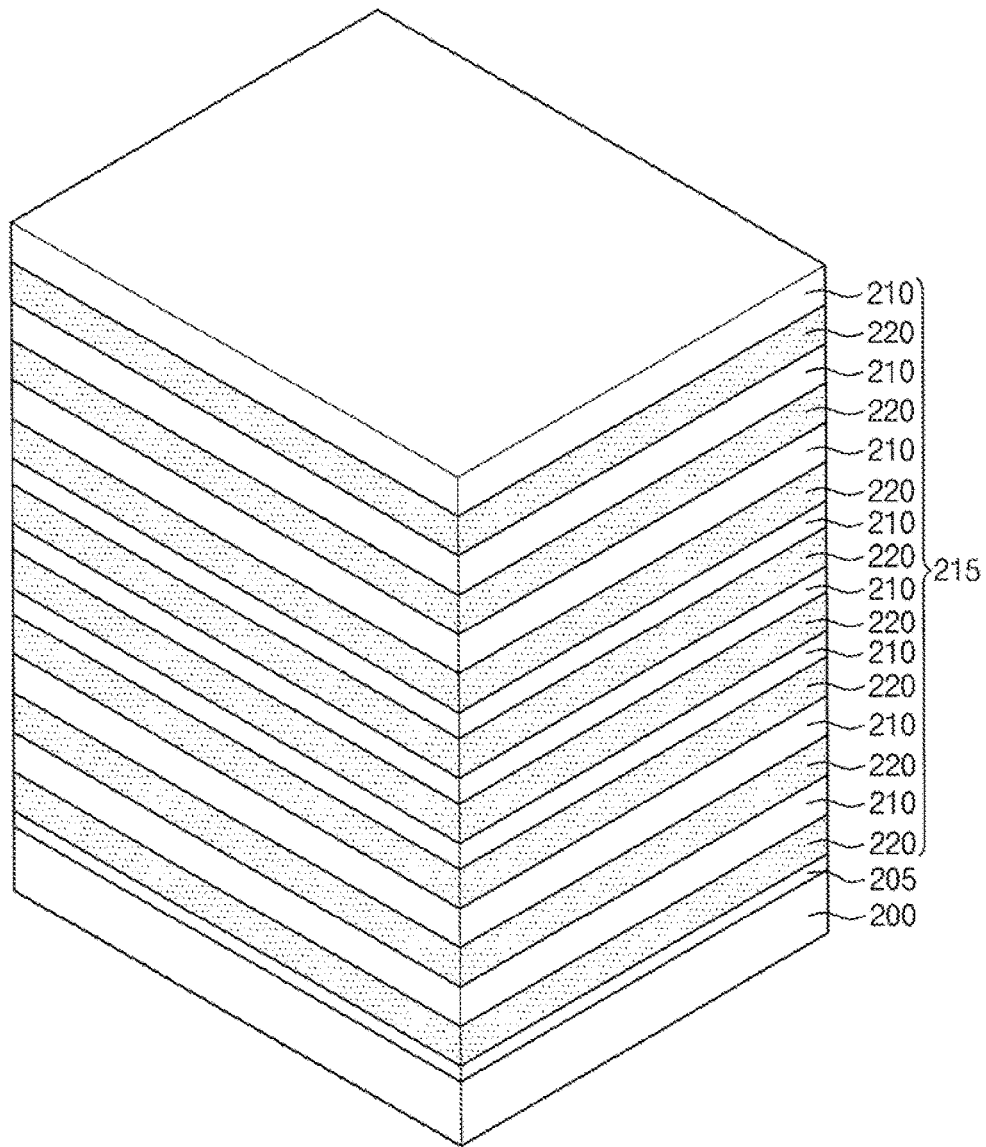
FIGS. 8A to 8J are perspective views illustrating a method of forming a nonvolatile memory device according to an embodiment of the inventive concept.

Referring to FIG. 8A, a thin layer structure 215 including a plurality of thin layers may be formed on a semiconductor substrate 200. The thin layer structure 215 may include first insulating layers 210 and second insulating layers 220 which are alternately and repeatedly stacked. For example, the thin layer structure 215 may include a plurality of the first insulating layers 210 sequentially stacked and a plurality of second insulating layers 220 interposed between the first insulating layers 210. The first insulating layers 210 may have thicknesses for satisfying the conditions as described with reference to FIG. 5. The conditions means that each of the first distance 1A between the ground select line GSL and the first dummy word line DWL1 and the second distance L2 between the first dummy word line DWL1 and the word line WL0 is greater than the third distance L3 between a pair of the word lines adjacent to each other.

The first insulating layers 210 may have wet etch rates different from wet etch rates of the second insulating layers 220. For example, the first insulating layers 210 may include silicon oxide layers, and the second insulating layers 220 may include silicon nitride layers. A buffer insulating layer 205 may be formed between the thin layer structure 215 and the semiconductor substrate 200. The buffer insulating layer 205 may include a silicon oxide layer.

Figure 8B:
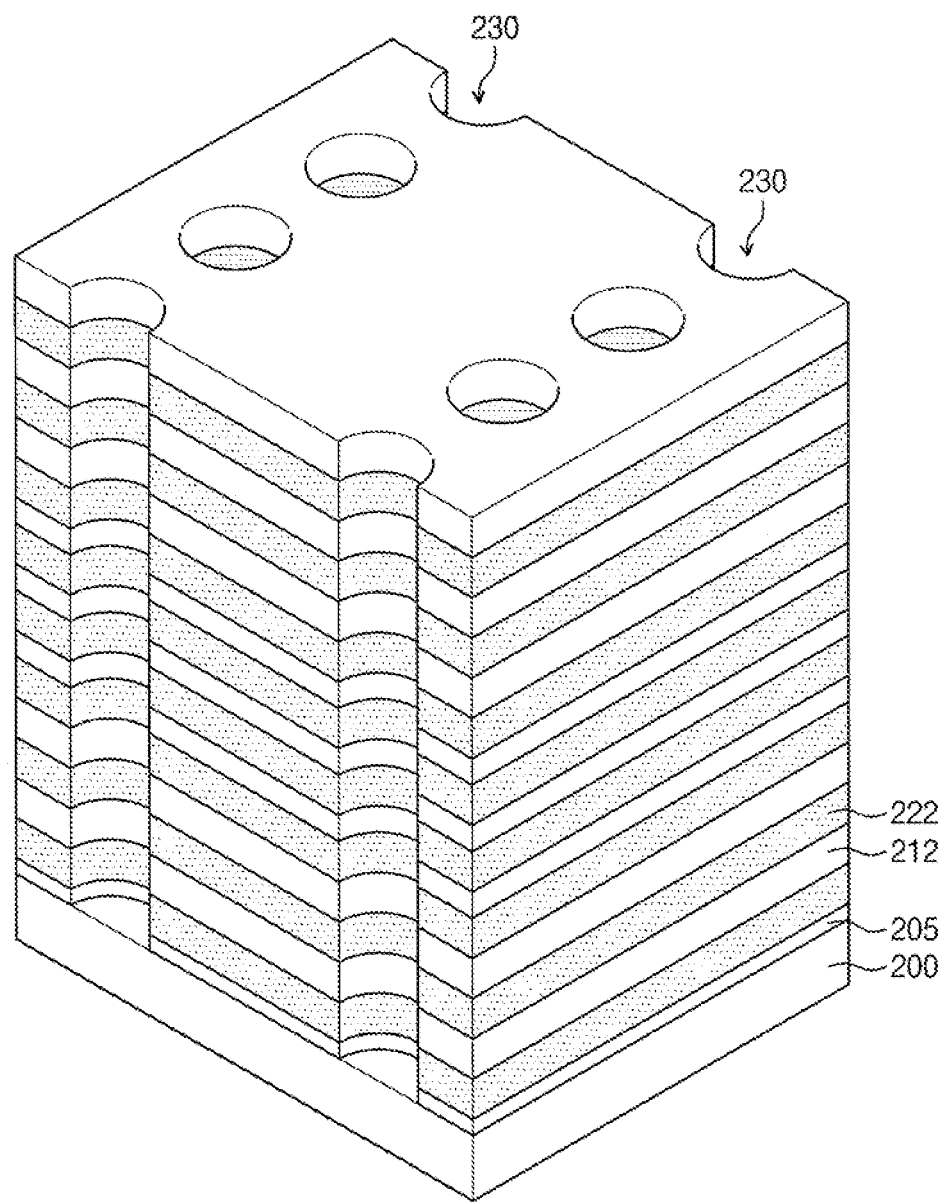

Referring to FIG. 8B, the thin layer structure 215 may be patterned to form a plurality of through regions 230 exposing a top surface of the semiconductor substrate 200. Patterning the thin layer structure 215 may include patterning the first insulating layers 210 and the second insulating layers 220 to form first insulating patterns 212 and second insulating patterns 222. In more detail, a mask pattern (not shown) defining top viewed locations of the through regions 230 may be formed on the thin layer structure 215, and then the thin layer structure 215 may be anisotropically etched using the mask pattern as an etch mask to form the through regions 230. The through regions 230 may be formed two dimensionally and regularly. Each of the through regions 230 may have a hole-shape which has a circular bottom surface exposing the top surface of the semiconductor substrate 200.

Figure 8C:
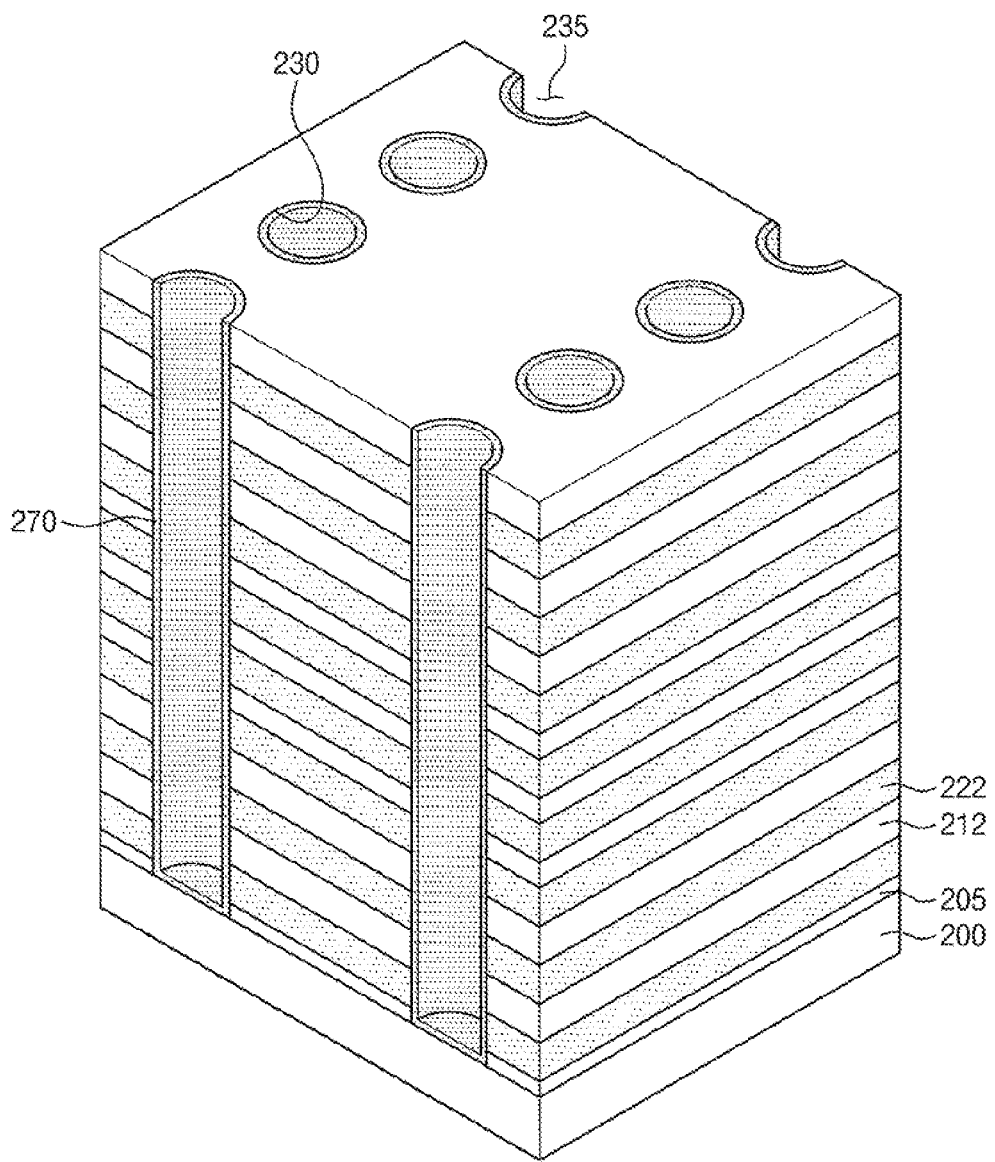

Referring to FIG. 8C, a semiconductor layer may be formed to cover the through regions 230. The semiconductor layer may be planarized to form a semiconductor pattern 270 in each of the through regions 230. The semiconductor pattern 270 may be formed to define a gap region 235 in each of the through regions 230. The semiconductor layer may be formed by a chemical vapor deposition (CVD) method.

Figure 8D:
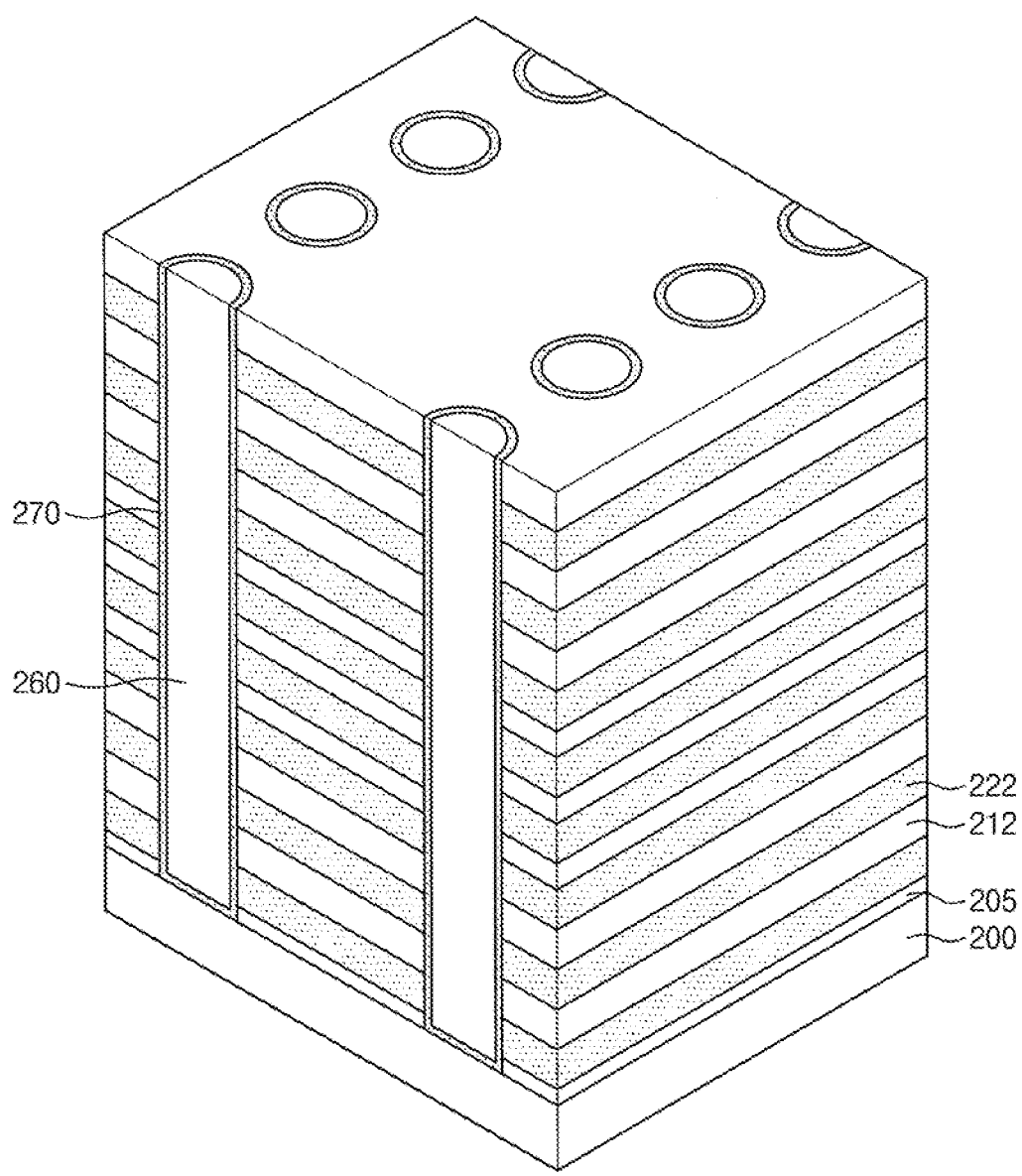

Referring to FIG. 8D, a filling layer 260 may be formed in the through region 230. The filling layer 260 may be formed to fill the gap region 235. An insulating layer filling the gap region 235 may be formed and then a planarization process may be performed on the insulating layer to form the filling layer 260. According to an embodiment, before the semiconductor patterns 270 are formed, the insulating layer filling the gap region 235 may be formed on the semiconductor layer, and then the insulating layer and the semiconductor layer may be subsequently planarized to form the filling layer 260 and the semiconductor pattern 270. Alternatively, the semiconductor layer may be formed to fill the through region 230, so that the filling layer 260 may not be formed.

Figure 8E:
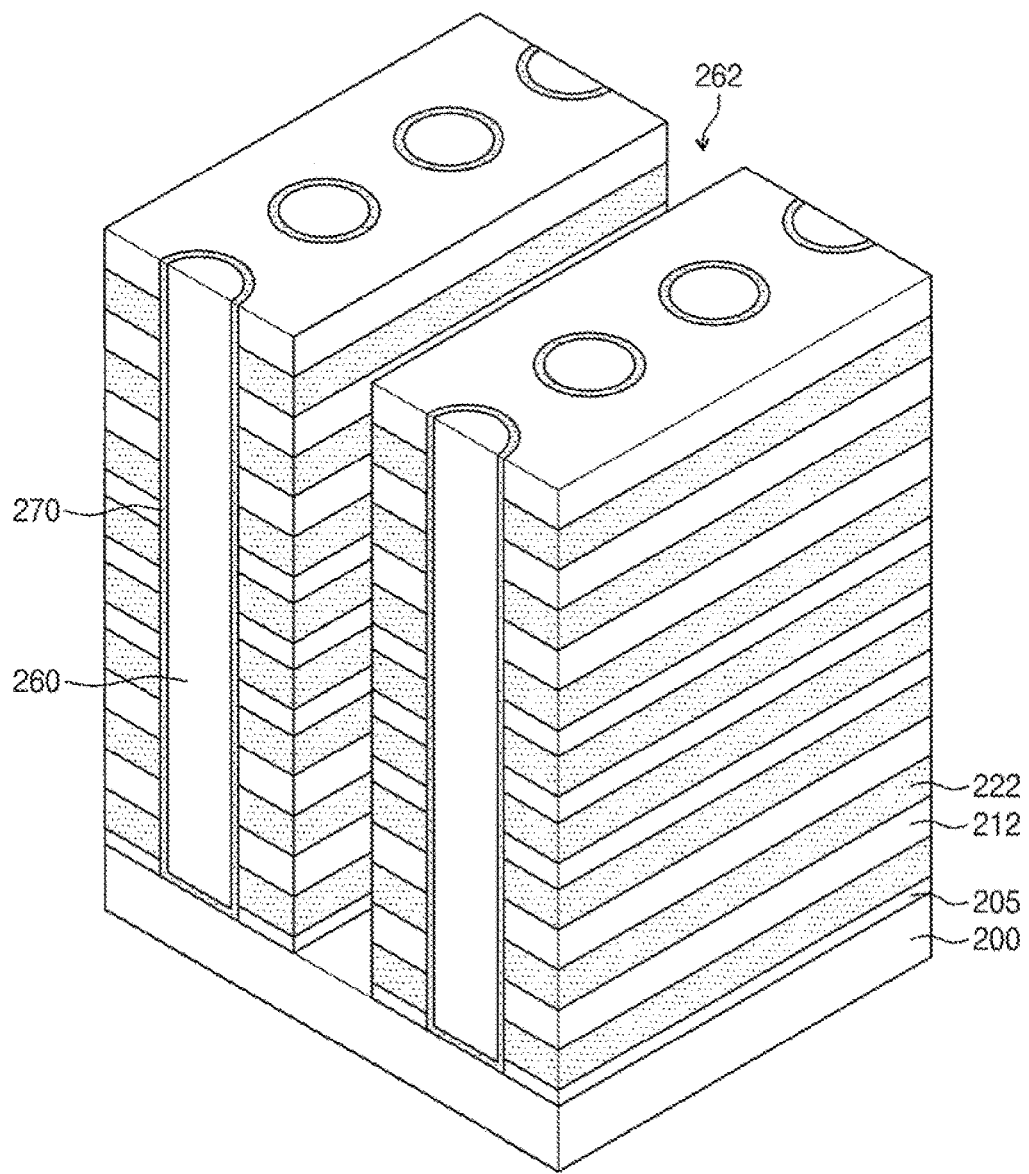

Referring to FIG. 8E, a first separation region 262 may be formed to divide the first and second insulating patterns 212 and 222 between the semiconductor patterns 270. The first separation region 262 may expose the semiconductor substrate 200. The first separation region 262 may be formed by an anisotropic etching process. The first separation region 262 may extend in one direction. The semiconductor patterns 270, which are arranged in the one direction to constitute a first column, may be disposed at one side of the first separation region 262. The semiconductor patterns 270, which are arranged in the one direction to constitute a second column, may be disposed at another side of the first separation region 262.

Figure 8F:
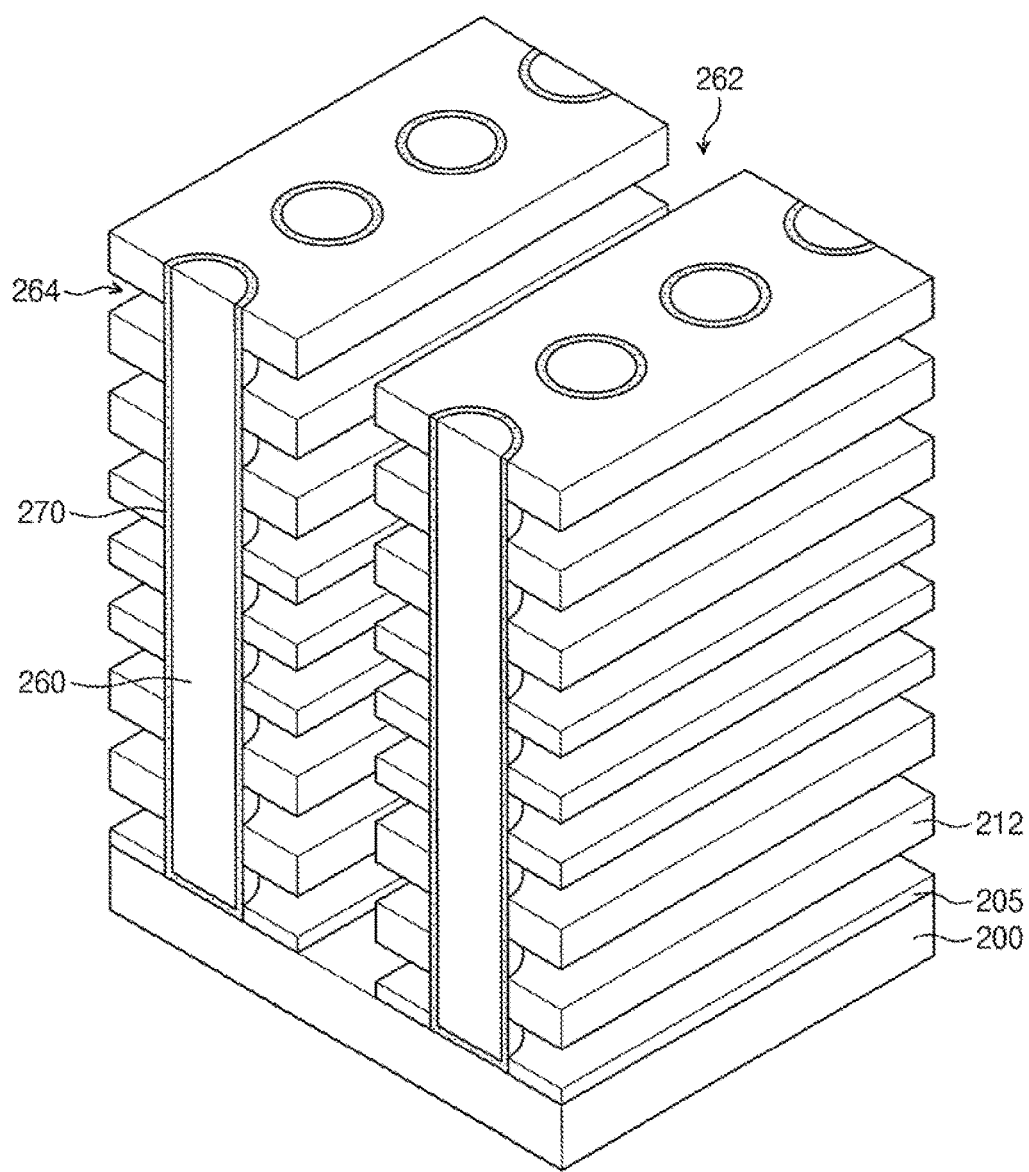

Referring to FIG. 8F, the second insulating patterns 222 exposed by the first separation region 262 may be removed to form undercut regions 264. Since the second insulating patterns 222 are removed, the semiconductor patterns 270 between the first insulating patterns 212 may be exposed. The second insulating patterns 222 may be removed by a wet etching process. The second insulating patterns 222 may have an etch selectivity with respect to the first insulating patterns 212.

Figure 8G:
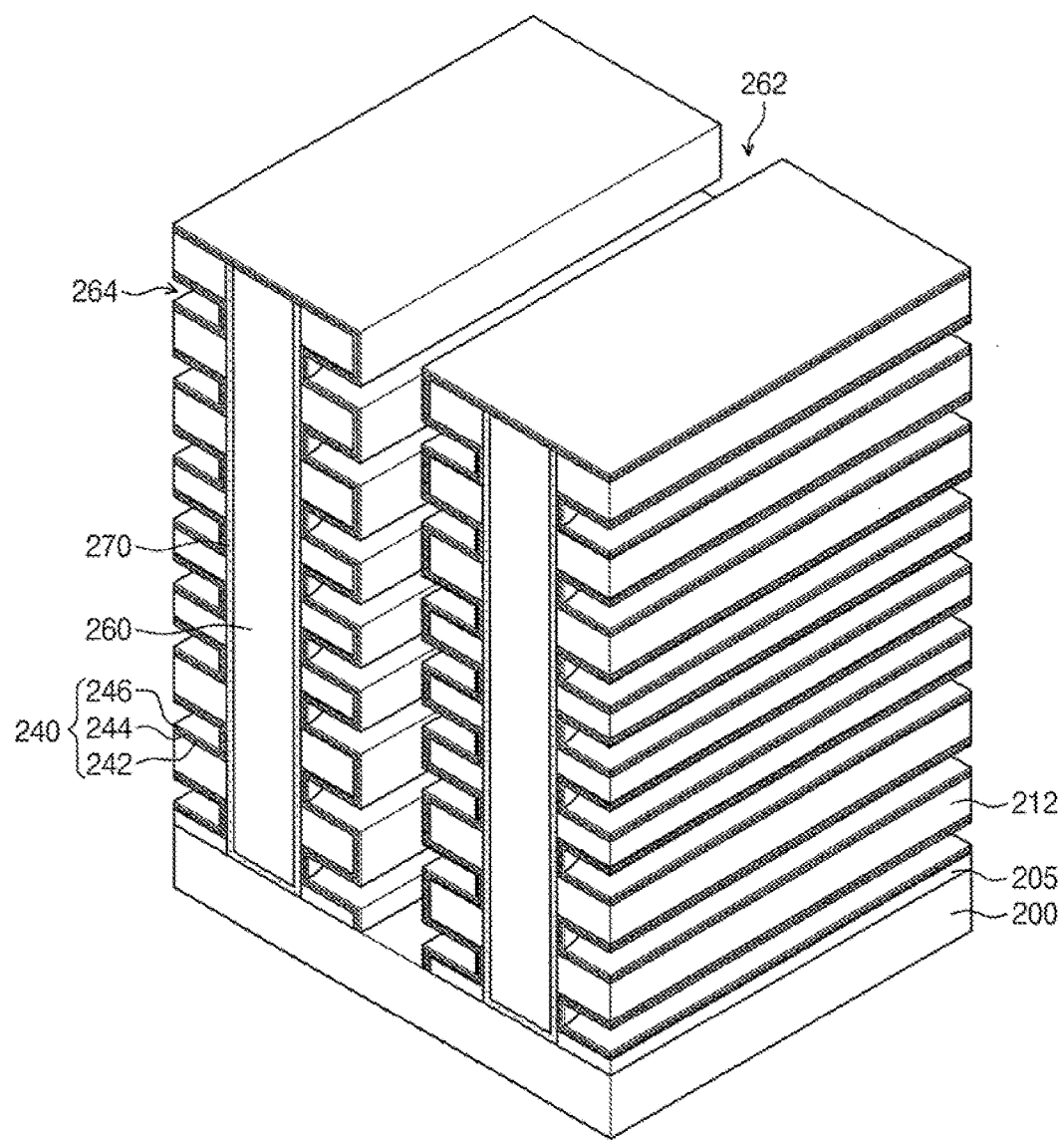

Referring to FIG. 8G, a data storage layer 240 may be formed to cover the exposed first insulating patterns 222 and semiconductor patterns 270. The data storage layer 240 may include a charge trapping layer 244 having charge trap sites. In more detail, the data storage layer 240 may include a tunnel insulating layer 242 contacting the semiconductor patterns 270, the charge trapping layer 244 on the tunnel insulating layer 242, and a blocking insulating layer 246 on the charge trapping layer 244. The charge trapping layer 244 may include a silicon nitride layer, the tunnel insulating layer 242 may include a silicon oxide layer or a multi-layer having the silicon oxide layer, and the blocking insulating layer 246 may include a high-k dielectric layer (e.g. an aluminum oxide layer or a hafnium oxide layer). The data storage layer 240 having three thin layers is illustrated in FIG. 8G. However, the embodiments of the inventive concept are not limited thereto. According to an embodiment, the data storage layer 240 may include thin layers more than three thin layers under data storing condition.

Figure 8H:
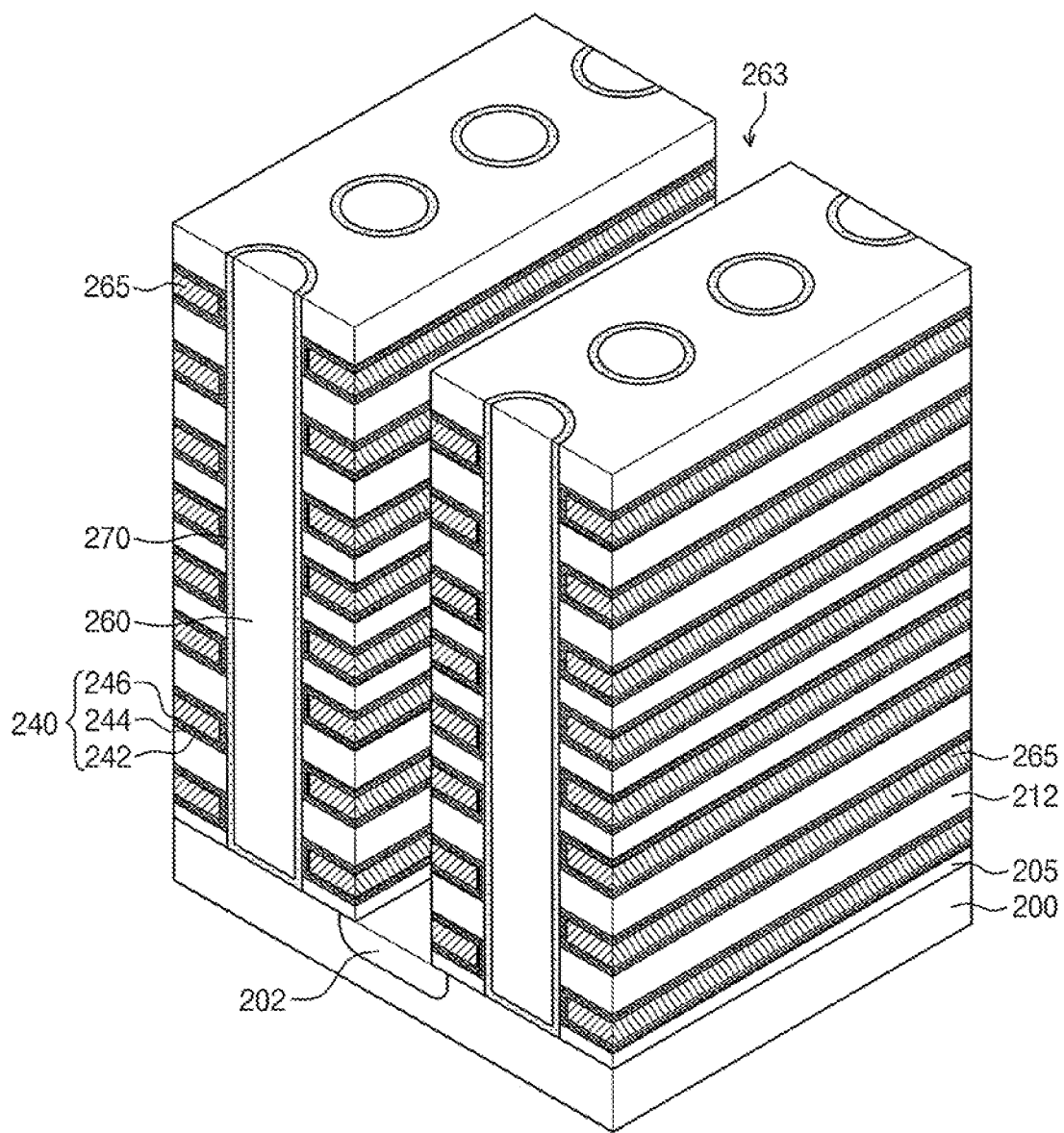

Referring to FIG. 8H, gate patterns 265 may be respectively formed in the undercut regions 264 between the first insulating patterns 212. The gate patterns 265 may be formed of poly silicon and/or metal. The gate patterns 265 may have line shapes extending in one direction. The formation process of the gate patterns 265 may include forming a gate conductive layer between the first insulating patterns 212 on which the data storage layer 240 is formed and patterning the gate conductive layer to form a second separation region 263 dividing the gate conductive layer.

The second separation region 263 may be formed at the same location as a location of the first separation region 262 and may expose sidewalls of the first insulating patterns 212. A common source region 202 may be formed in the semiconductor substrate 200 exposed by the second separation region 263. The common source region 202 may be formed by an ion implantation process.

Figure 8I:
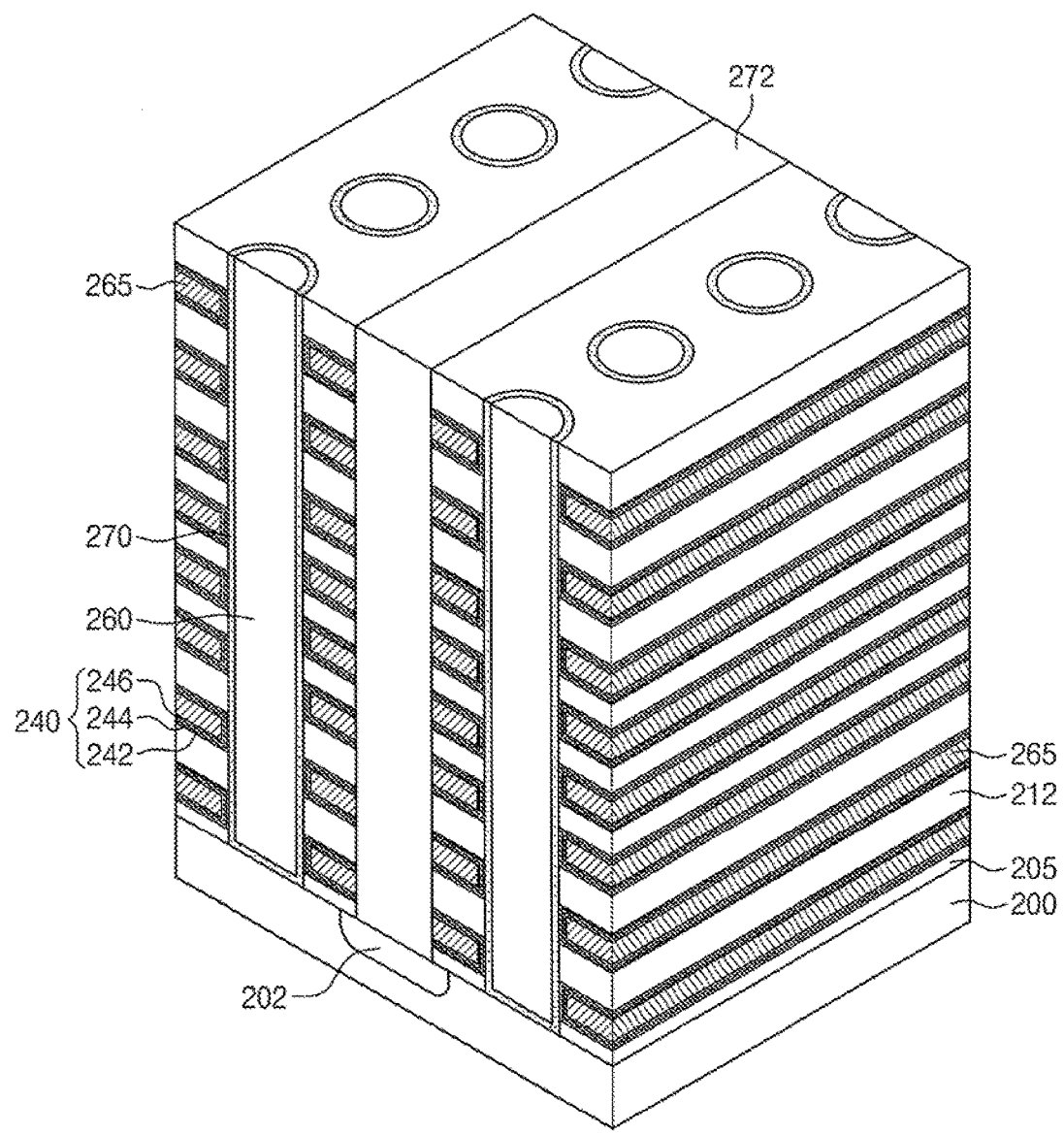

Referring to FIG. 8I, a separation insulating layer 272 filling the second separation region 263 may be formed. The separation insulating layer 272 may include a silicon oxide layer. The semiconductor pattern 270 and the gate patterns 265 may constitute transistors three dimensionally arranged.

Figure 8J:
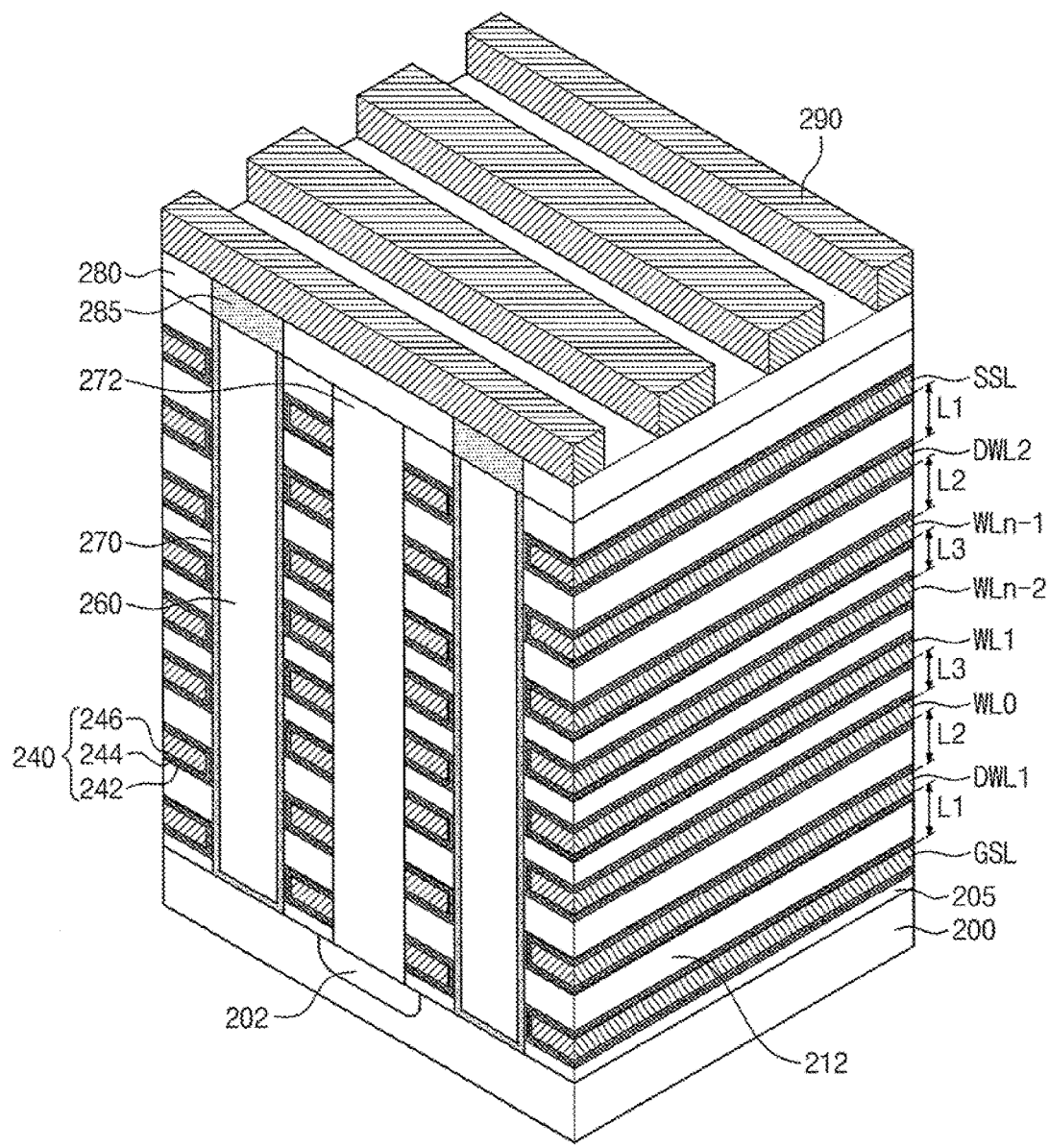

Referring to FIG. 8J, bit lines 290 may be formed to be electrically connected to the semiconductor patterns 270. The bit line 290 may extend in a direction crossing a direction in which the grate pattern extends. An upper interlayer insulating layer 280 may be formed on the semiconductor pattern 270 and the gate patterns. Contact plugs 285 may be formed in the upper interlayer insulating layer 280. The contact plug 285 may electrically connect the bit lines 290 to the semiconductor patterns 270.

The gate patterns may include a plurality of word lines WL0 to WLn−1, a ground select line GSL under the word lines WL0 to WLn−1, a string select line SSL on the word lines WL0 to WLn−1, a first dummy word line DWL1 between the ground select line GSL and the word line WL0 which is a word line nearest to the ground select line GSL among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

Figure 9A:
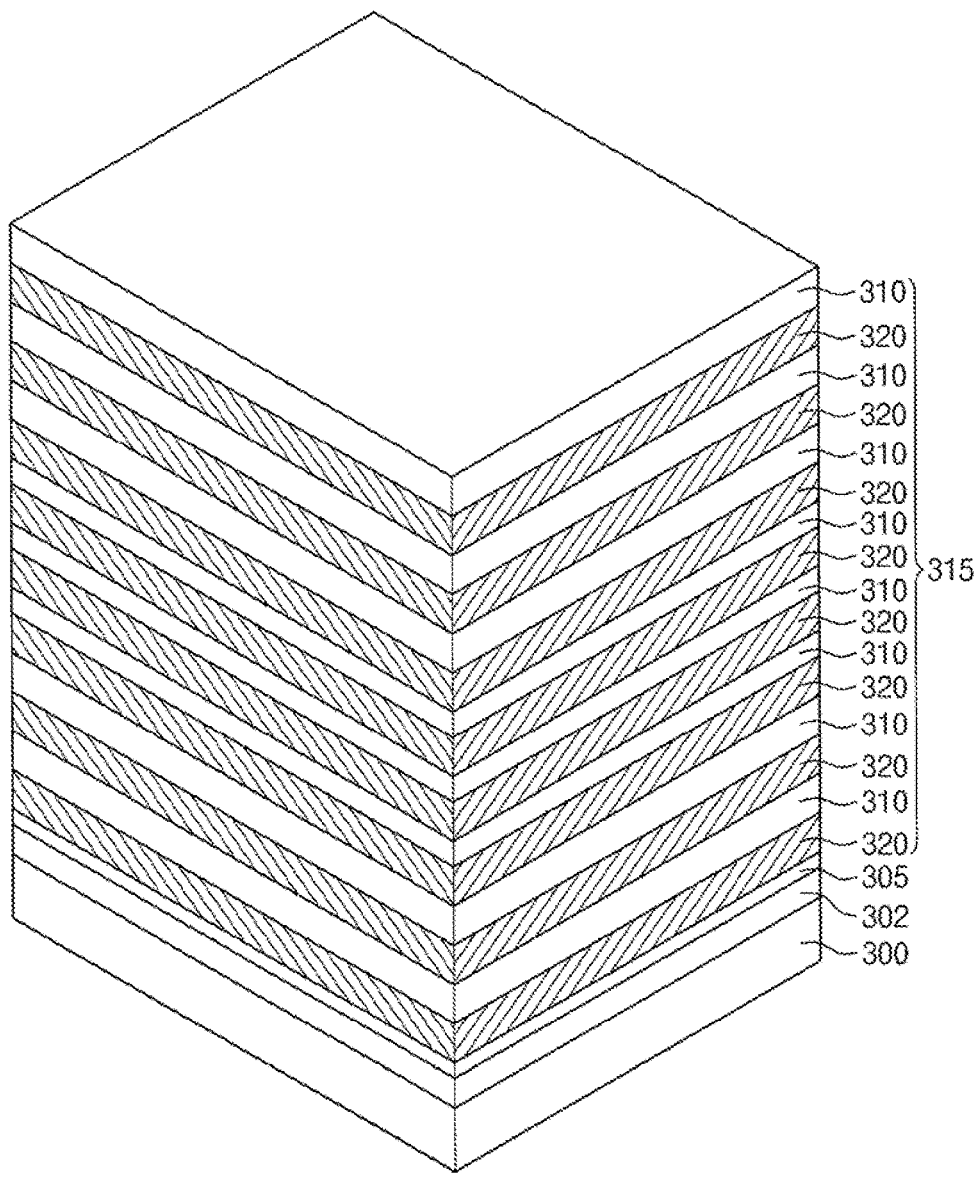
FIGS. 9A to 9G are perspective views illustrating a method of forming a nonvolatile memory device according to an embodiment of the inventive concept.

FIGS. 9A to 9G are perspective views illustrating a method of forming a nonvolatile memory device according to an embodiment of the inventive concept. Referring to FIG. 9A, a thin layer structure 315 including a plurality of thin layers may be formed on a semiconductor substrate 300. The semiconductor substrate 300 may be formed of single-crystalline silicon. Alternatively, the semiconductor substrate 300 may be formed of a semiconductor material providing other semiconductor characteristics than the single-crystalline silicon.

The thin layer structure 315 may include insulating layers 310 and conductive layers 320 which are alternately and repeatedly stacked. For example, the thin layer structure 315 may include a plurality of the insulating layers 310 sequentially stacked and a plurality of the conductive layers 320 interposed between the insulating layers 310. Thicknesses of the insulating layers 310 may determine the first, second and third distances L1, L2 and L3 described with reference to FIG. 5. For example, the first insulating layers 310 may have thicknesses for satisfying the conditions that each of the first distance L1 between the ground select line GSL and the first dummy word line DWL1 and the second distance L2 between the first dummy word line DWL1 and the word line WL0 is greater than the third distance L3 between a pair of the word lines adjacent to each other.

For example, each of the insulating layers 310 may include a silicon oxide layer and/or a silicon nitride layer, and each of the conductive layers 320 may formed of poly-crystalline silicon doped with impurities and/or a metallic material. A buffer insulating layer 305 may be formed between the semiconductor substrate 300 and the thin layer structure 315. The buffer insulating layer 305 may include a silicon oxide layer.

Figure 9B:
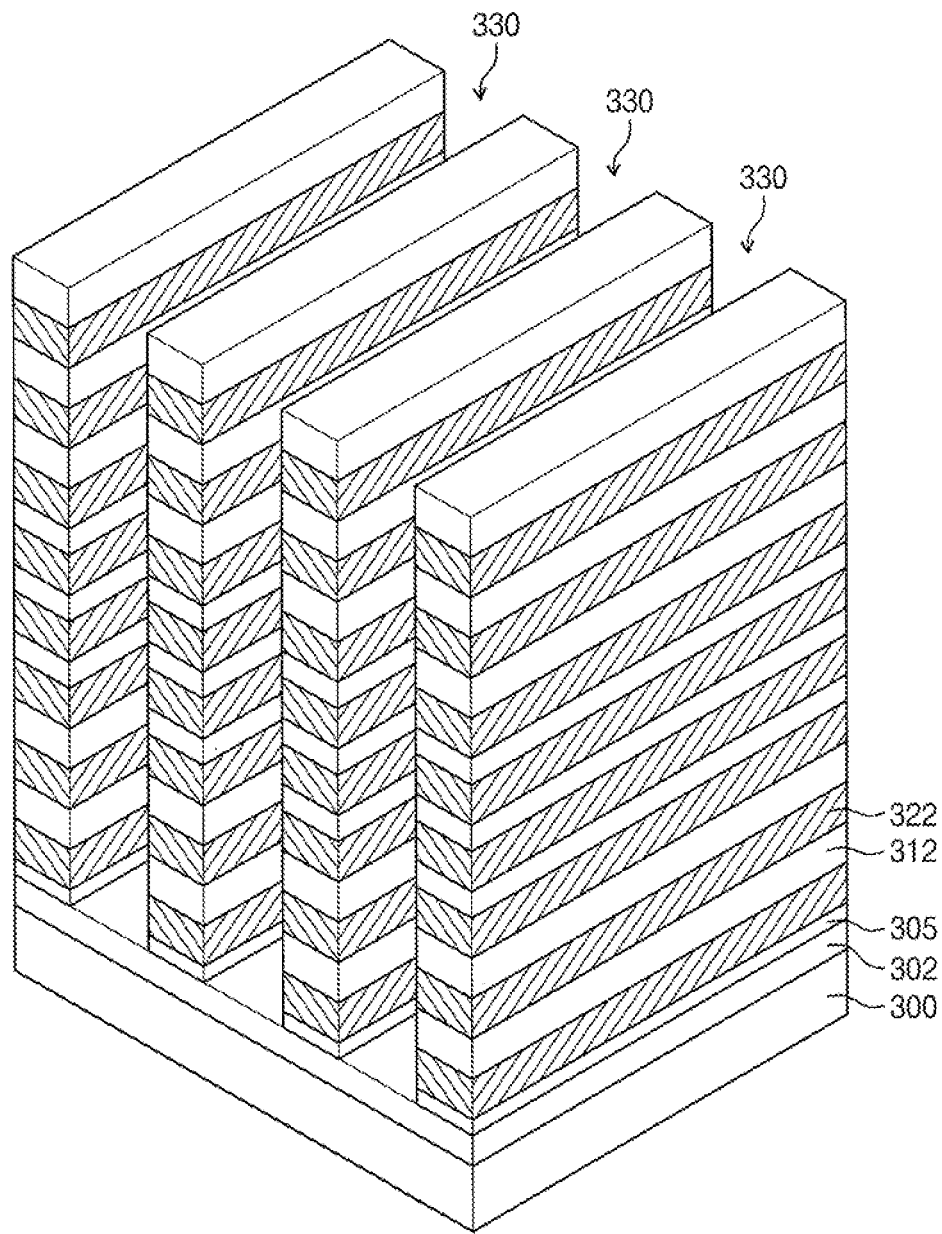

Referring to FIG. 9B, the thin layer structure 315 may be patterned to form a plurality of through regions 330 exposing a top surface of the semiconductor substrate 300. Patterning the thin layer structure 315 may include patterning the insulating layers 310 and the conductive layers 320 to form insulating patterns 312 and gate patterns 322. In more detail, a mask pattern (not shown) defining top viewed locations of the through regions 330 may be formed on the thin layer structure 315, and then the thin layer structure 315 may be anisotropically etched using the mask pattern as an etch mask to form the through regions 330. The through regions 330 may be formed two dimensionally and regularly.

As illustrated in FIG. 9B, each of the through regions 330 may be a trench which has a rectangular bottom surface exposing the semiconductor substrate 300. A lowermost gate pattern of the stacked gate patterns 322 may be used as a ground select line, and an uppermost gate pattern of the stacked gate patterns 322 may be used as a string select line.

Figure 9C:
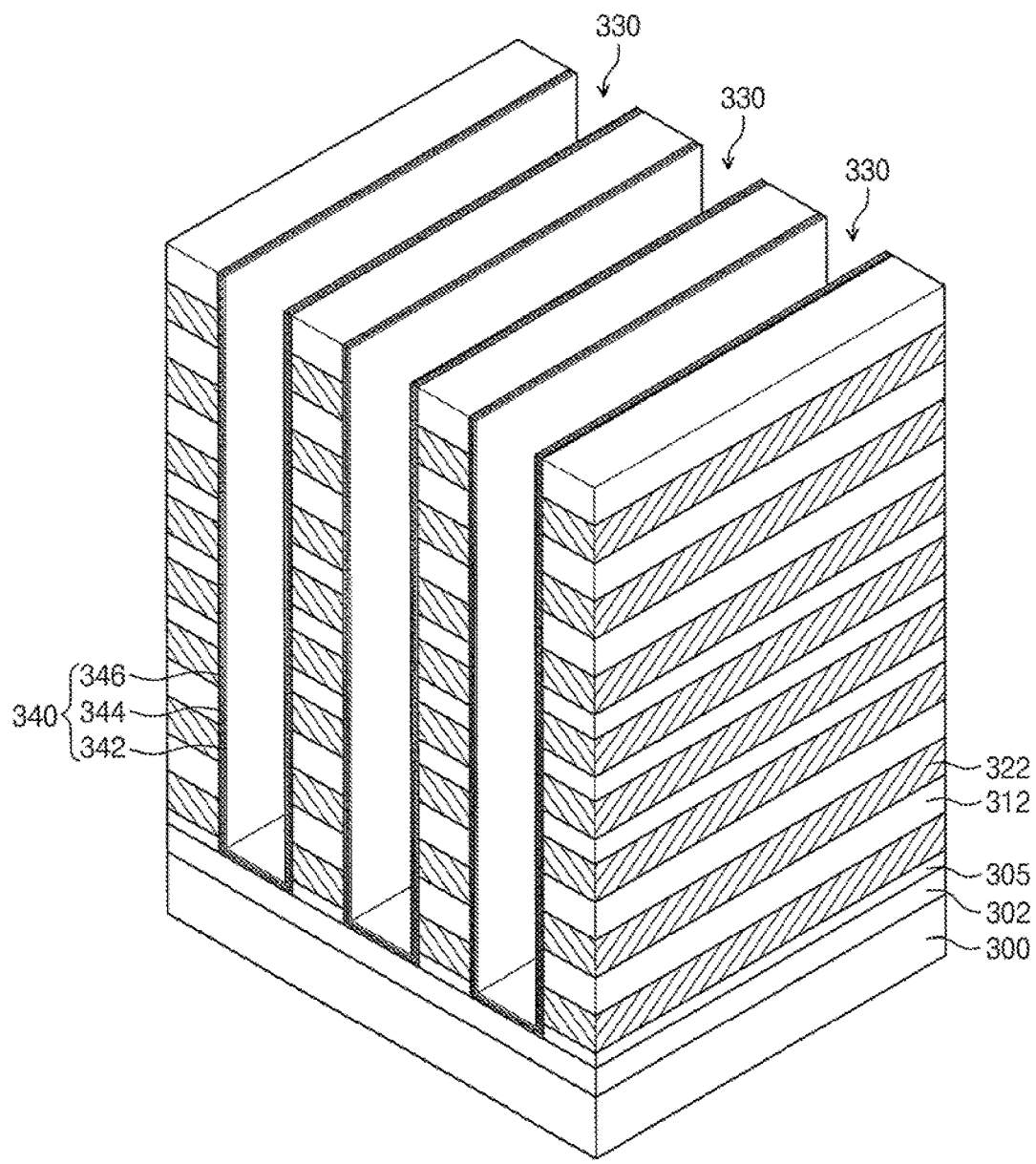

Referring to FIG. 9C, a data storage layer 340 may be formed to cover the inner sidewalls of the through regions 330. The data storage layer 340 may include a charge trapping layer 344 having charge trap sites. The data storage layer 340 may further include a blocking insulating layer 346 contacting the gate patterns 322 and a tunnel insulating layer 342. Charges may tunnel the tunnel insulating layer 342. The charge trapping layer 344 may include a silicon nitride layer formed between the tunnel insulating layer 342 and the blocking insulating layer 346. The tunnel insulating layer 342 may include a silicon oxide layer. The blocking insulating layer 346 may include a high-k dielectric layer (e.g. an aluminum oxide layer or a hafnium oxide layer).

However, the data storage layer 340 is not limited to the thin layers described above. According to an embodiment, the data storage layer 340 may include a thin layer (e.g. a thin layer for a variable resistance memory) storing data by other operation principles. A preliminary data storage layer may be conformally formed on the inner sidewalls of the through region 330 and the semiconductor substrate 300 under the through regions 330, and then a portion of the preliminary data storage layer covering the semiconductor substrate 300 may be etched using spacers (not shown) covering the inner sidewalls of the through regions 330 as etch masks to form the data storage layer 340. The spacers may include an insulating layer. The spacers may be removed after the data storage layer 340 is formed.

Figure 9D:
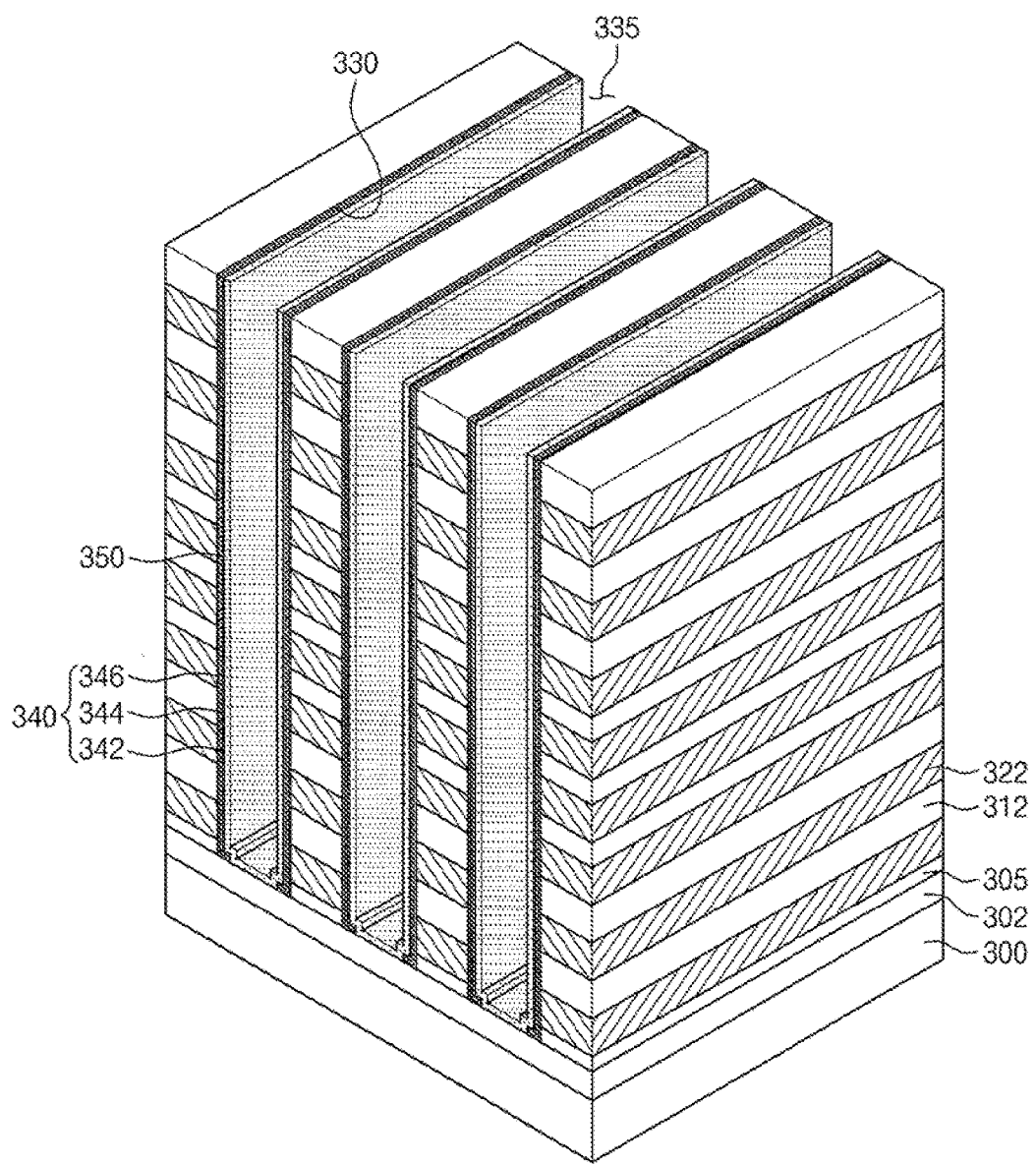

Referring to FIG. 9D, a semiconductor layer 350 may be formed to cover the through regions 330. The semiconductor layer 350 may be formed to define a gap region 335 in each of the through regions 330. The semiconductor layer 150 may be formed by a chemical vapor deposition (CVD) method. The semiconductor layer 350 may be used as a channel region of the semiconductor memory device as described below.

Figure 9E:
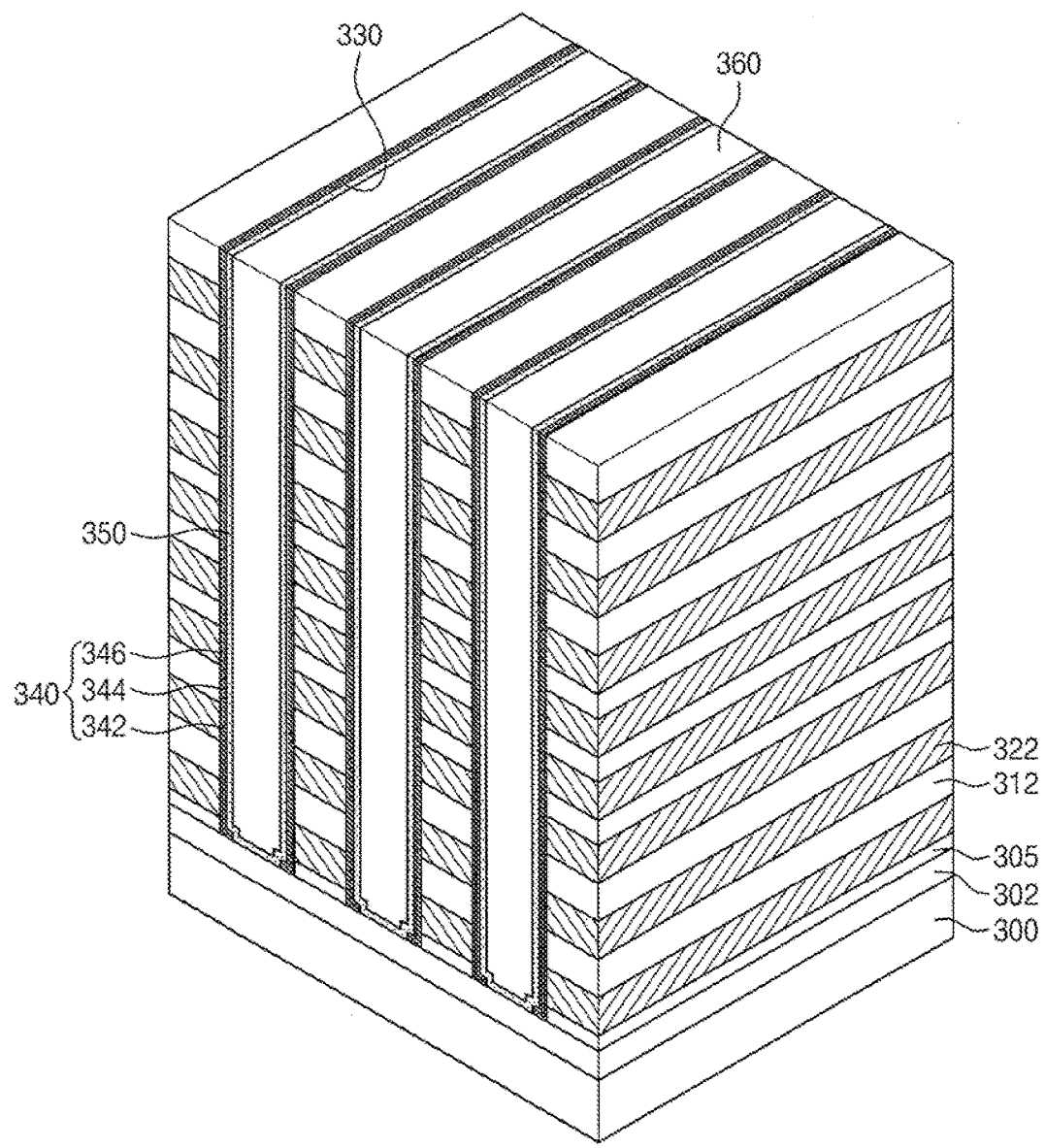

Referring to FIG. 9E, a filling layer 360 may be formed in the through region 330. The filling layer 360 may be formed to fill the gap region 335. An insulating layer filling the gap region 335 may be formed and then a planarization process may be performed on the insulating layer to form the filling layer 360. Alternatively, the semiconductor layer 350 may be formed to fill the through region 330, so that the filling layer 360 may not be formed.

Figure 9F:
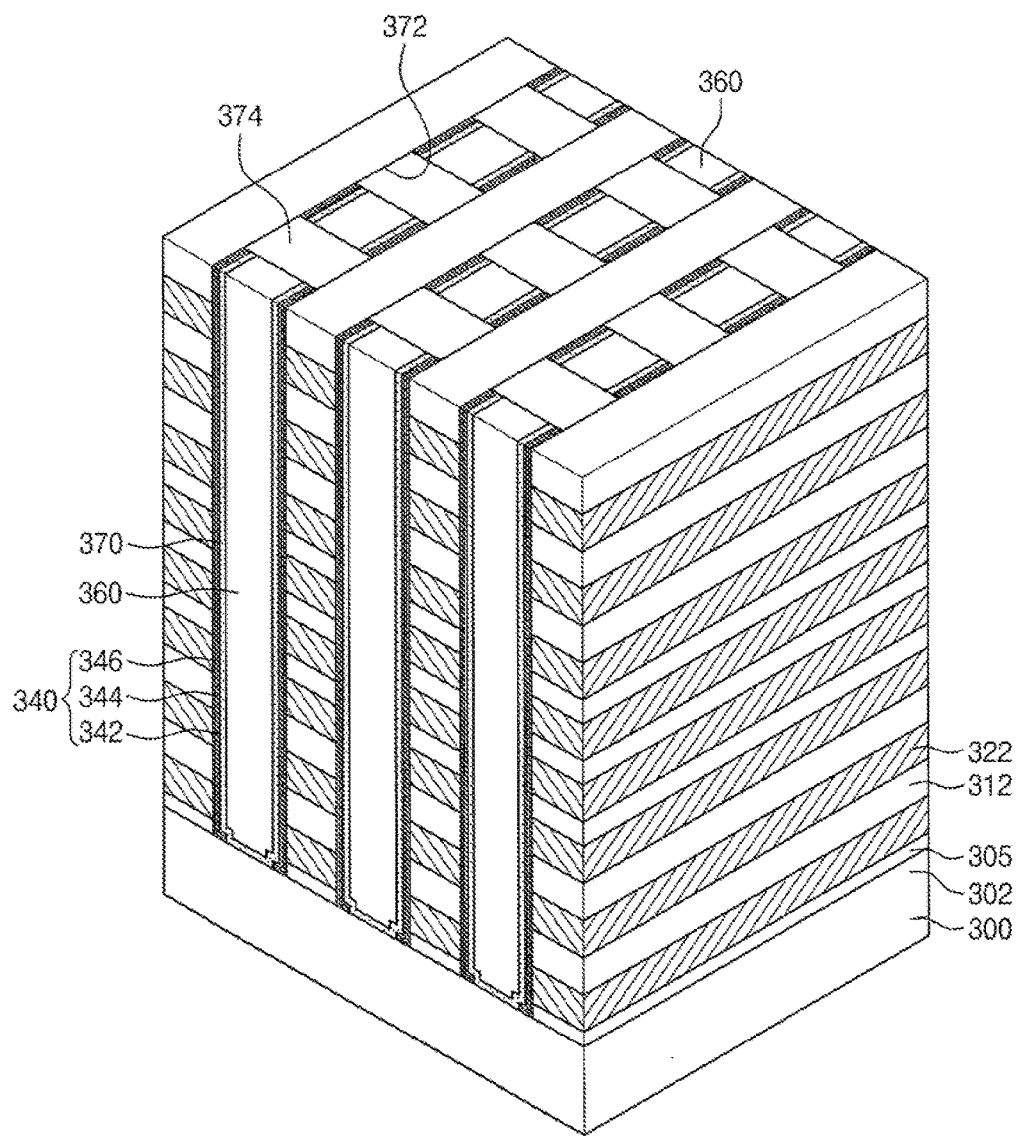

Referring to FIG. 9F, the semiconductor layer 350 may be patterned to form semiconductor patterns 370 upwardly extending from the semiconductor substrate 300 in the through regions 330. The semiconductor patterns 370 and the gate patterns may constitute transistors three dimensionally arranged. Patterning the semiconductor layer 350 may include forming separation regions 372 dividing the semiconductor layer 350 into the semiconductor patterns 370. Each of the separation regions 372 may be filled with a gapfill insulating layer 374. The gapfill insulating layer 374 may include a silicon oxide layer.

Figure 9G:
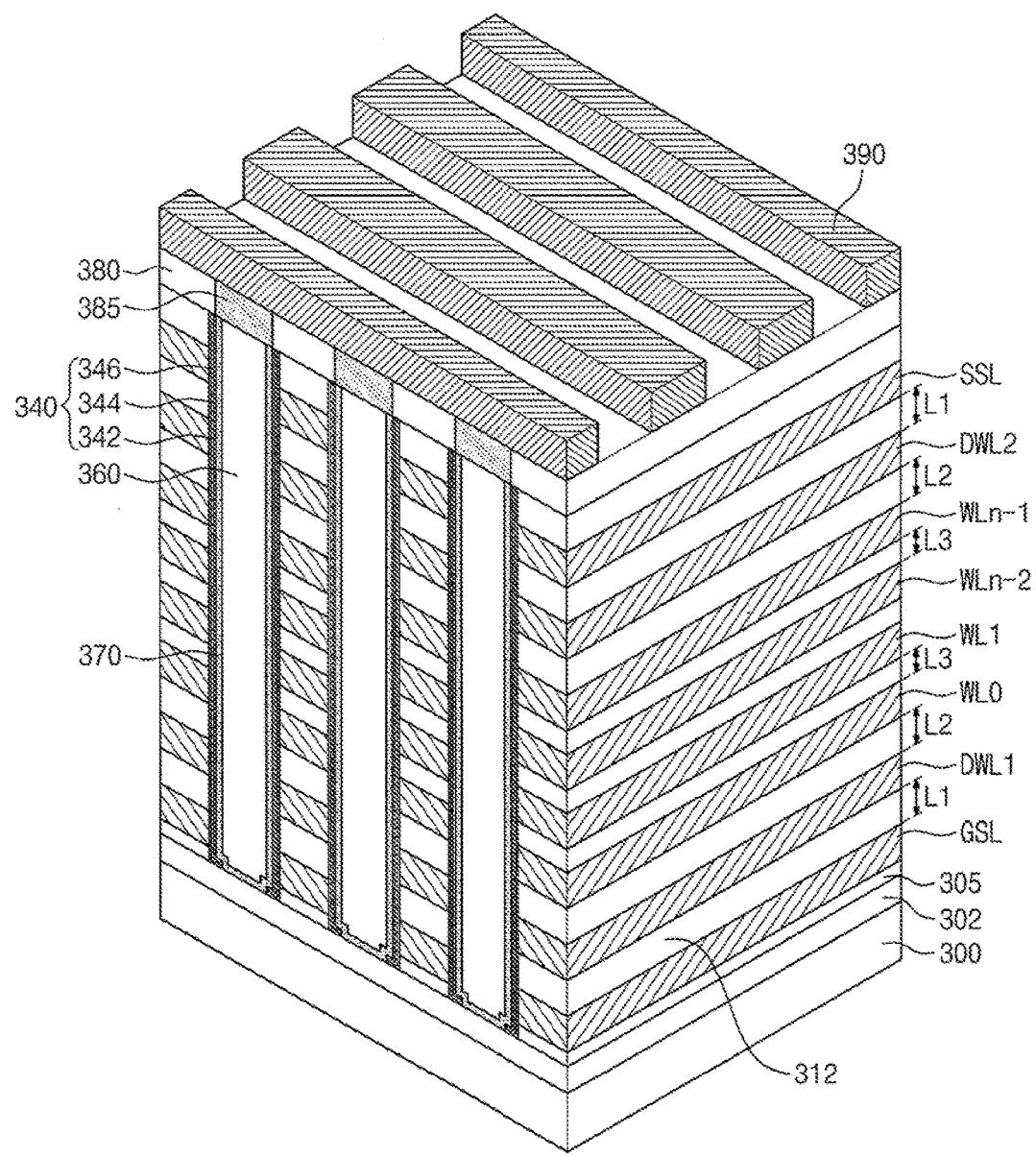

Referring to FIG. 9G, an upper interlayer insulating layer 380 may be formed on the gapfill insulating layer 374 and the semiconductor patterns 370. Contact plugs 385 may be formed in the upper interlayer insulating layer 380 to be electrically connected to the semiconductor patterns 370, respectively. Bit lines 390 may be formed to be electrically connected to the contact plugs 385. The bit line 390 may extend in a direction crossing a direction in which the gate pattern extends.

The gate patterns may include a plurality of word lines WL0 to WLn−1, a ground select line GSL under the word lines WL0 to WLn−1, a string select line SSL on the word lines WL0 to WLn−1, a first dummy word line DWL1 between the ground select line GSL and the word line WL0 which is a word line nearest to the ground select line GSL among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

FIGS. 10A to 10G are perspective views illustrating a method of forming a nonvolatile memory device according to an embodiment of the inventive concept.

Figure 10A:
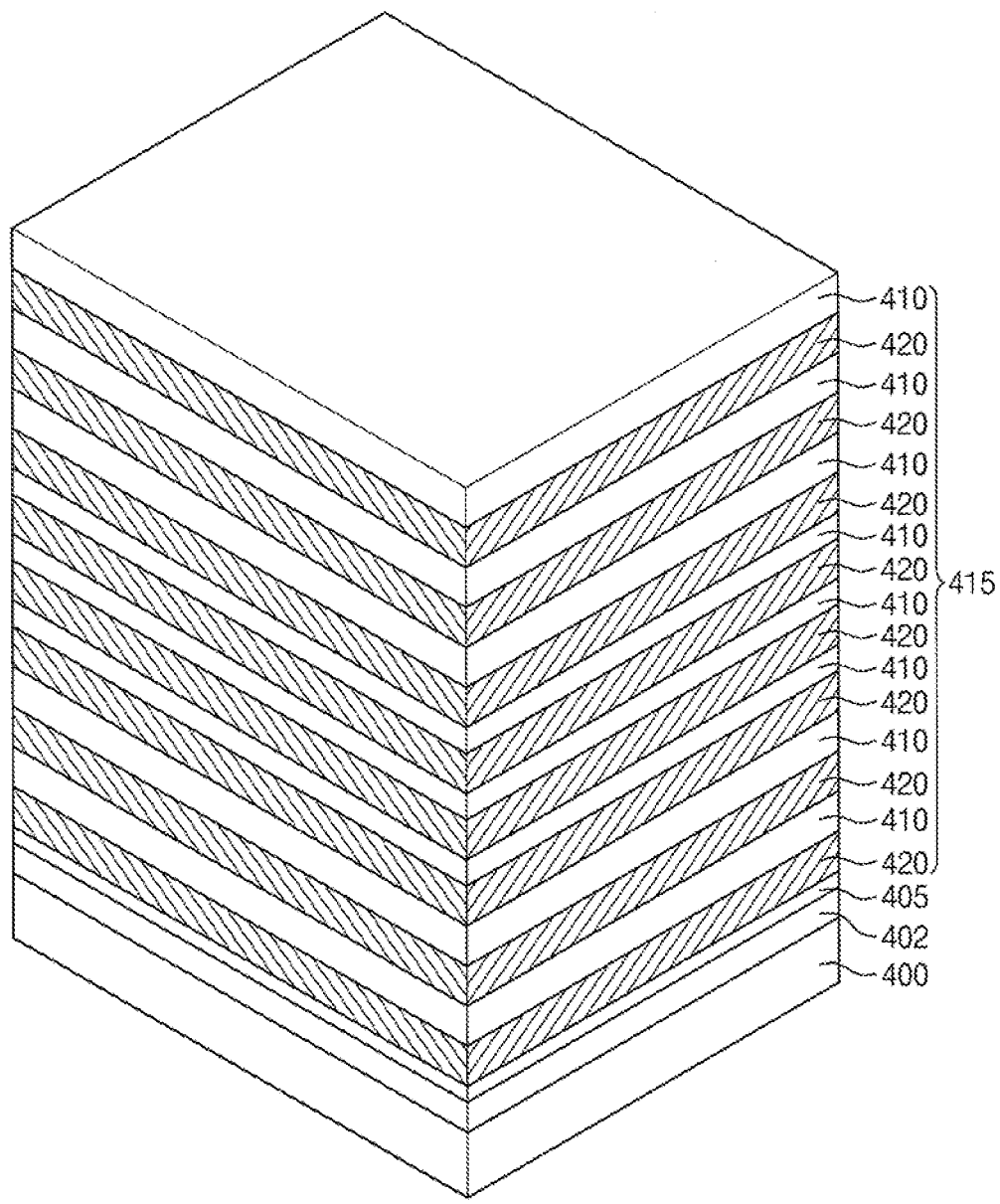
FIGS. 10A to 10G are perspective views illustrating a method of forming a nonvolatile memory device according to an embodiment of the inventive concept.

Referring to FIG. 10A, a thin layer structure 415 including a plurality of thin layers may be formed on a semiconductor substrate 400. The semiconductor substrate 400 may be formed of single-crystalline silicon. Alternatively, the semiconductor substrate 400 may be formed of a semiconductor material providing other semiconductor characteristics than the single-crystalline silicon.

The thin layer structure 415 may include insulating layers 410 and conductive layers 420 which are alternately and repeatedly stacked. For example, the thin layer structure 415 may include a plurality of the insulating layers 410 sequentially stacked and a plurality of the conductive layers 420 interposed between the insulating layers 410. For example, each of the insulating layers 410 may include a silicon oxide layer and/or a silicon nitride layer, and each of the conductive layers 420 may be formed of poly-crystalline silicon doped with impurities and/or a metallic material. A buffer insulating layer 405 may be formed between the semiconductor substrate 400 and the thin layer structure 415. The buffer insulating layer 405 may include a silicon oxide layer.

Figure 10B:
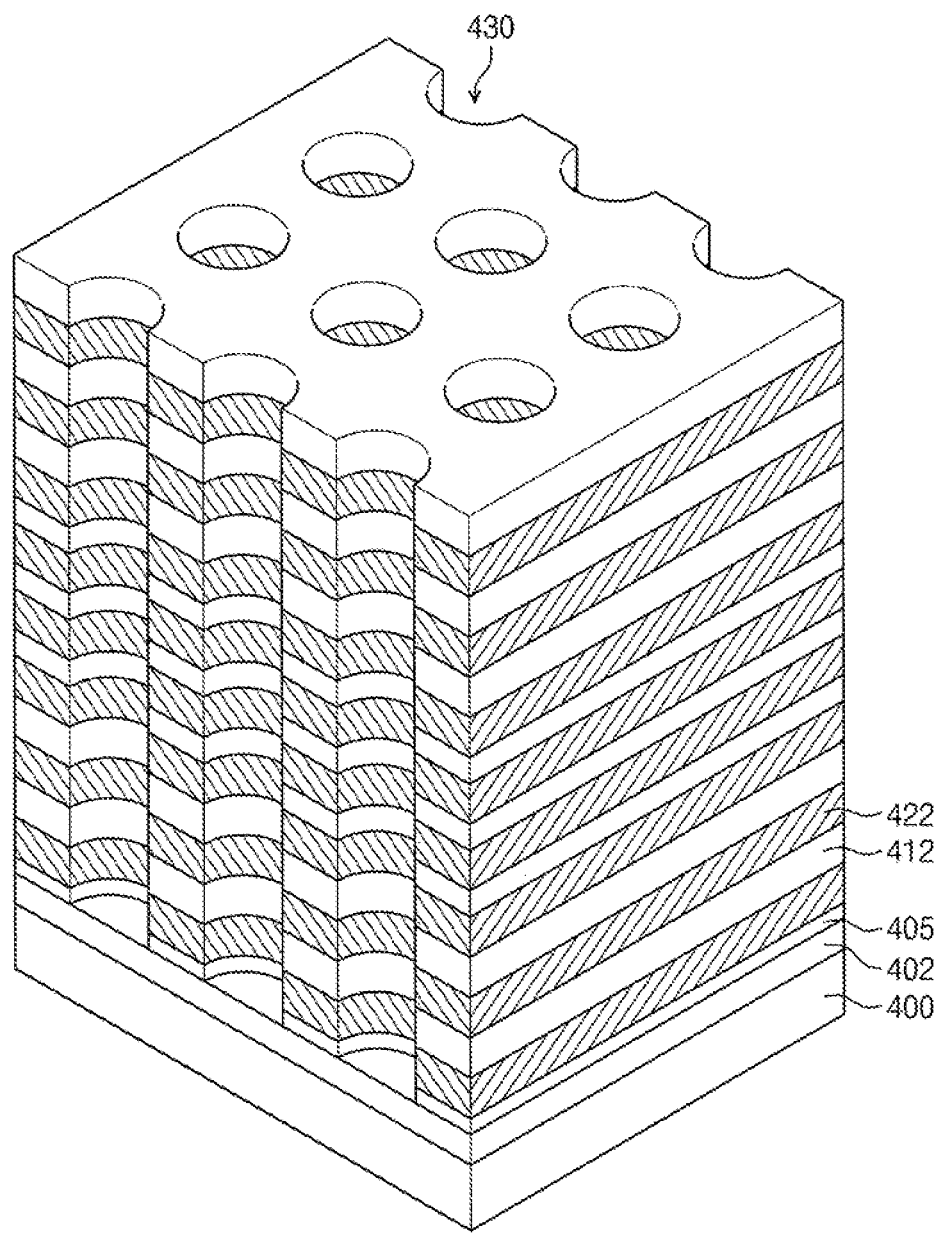

Referring to FIG. 10B, the thin layer structure 415 may be patterned to form a plurality of through regions 430 exposing a top surface of the semiconductor substrate 400. Patterning the thin layer structure 415 may include patterning the insulating layers 410 and the conductive layers 420 to form insulating patterns 412 and gate patterns 422. In more detail, a mask pattern (not shown) defining top viewed locations of the through regions 430 may be formed on the thin layer structure 415, and then the thin layer structure 415 may be anisotropically etched using the mask pattern as an etch mask to form the through regions 430. The through regions 430 may be formed two dimensionally and regularly.

As illustrated in FIG. 10B, each of the through regions 430 may have a hole-shape which has a circular bottom surface exposing the semiconductor substrate 400. A lowermost gate pattern of the stacked gate patterns 422 may be used as a ground select line.

Figure 10C:
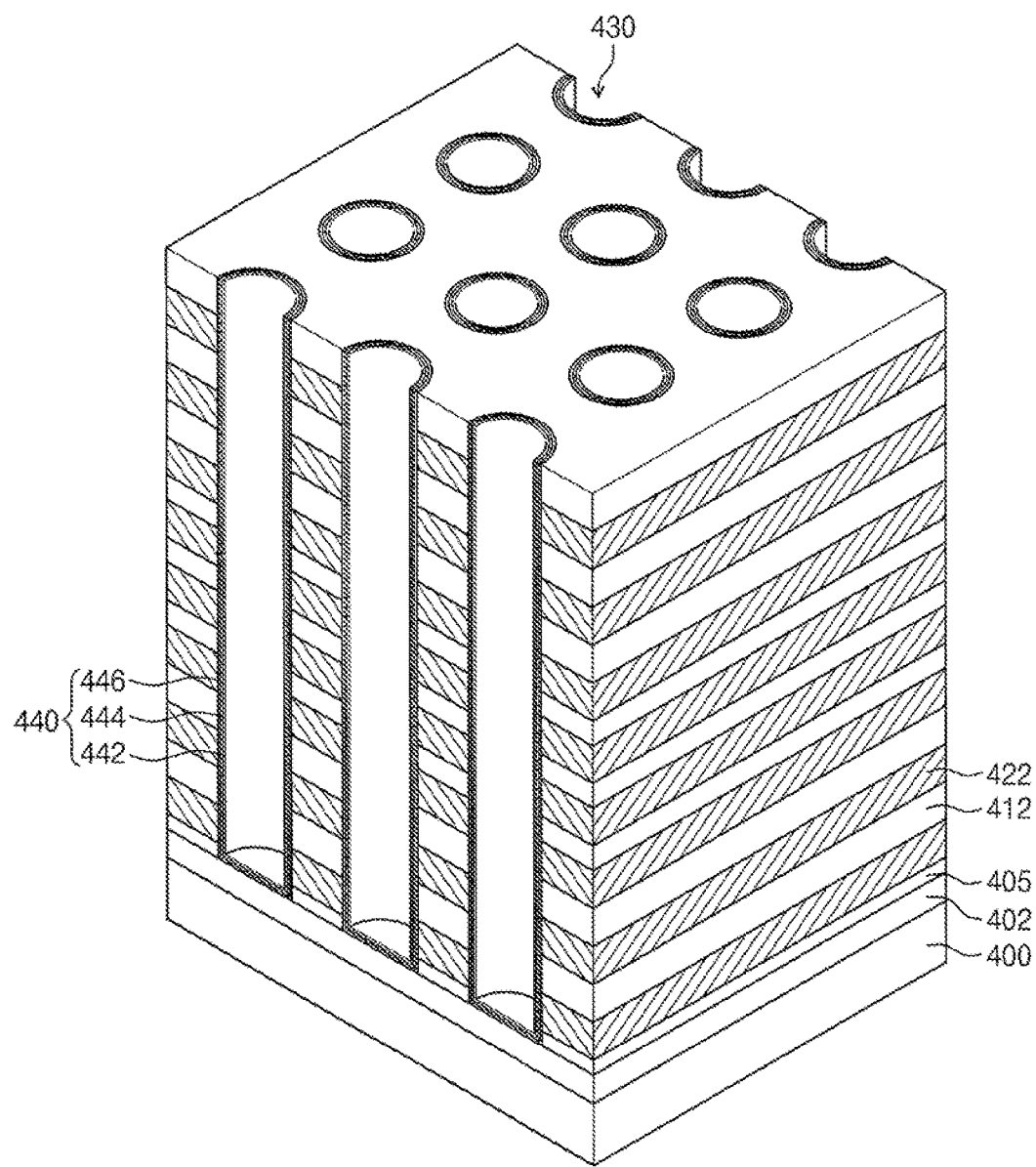

Referring to FIG. 10C, a data storage layer 440 may be formed to cover the inner sidewalls of the through regions 430. The data storage layer 440 may include a charge trapping layer 444 having charge trap sites. The data storage layer 440 may further include a blocking insulating layer 446 contacting the gate patterns 422 and a tunnel insulating layer 442. Charges may tunnel the tunnel insulating layer 442. The charge trapping layer 444 may include a silicon nitride layer formed between the tunnel insulating layer 442 and the blocking insulating layer 446. The tunnel insulating layer 442 may include a silicon oxide layer. The blocking insulating layer 446 may include a high-k dielectric layer (e.g. an aluminum oxide layer or a hafnium oxide layer).

However, the data storage layer 440 is not limited to the thin layers described above. According to an embodiment, the data storage layer 440 may include a thin layer (e.g. a thin layer for a variable resistance memory) storing data by other operation principles. A preliminary data storage layer may be conformally formed on the inner sidewalls of the through region 430 and the semiconductor substrate 400 under the through regions 430, and then a portion of the preliminary data storage layer covering the semiconductor substrate 400 may be etched using spacers (not shown) covering the inner sidewalls of the through regions 430 as etch masks to form the data storage layer 440. The spacers may include an insulating layer. The spacers may be removed after the data storage layer 440 is formed.

Figure 10D:
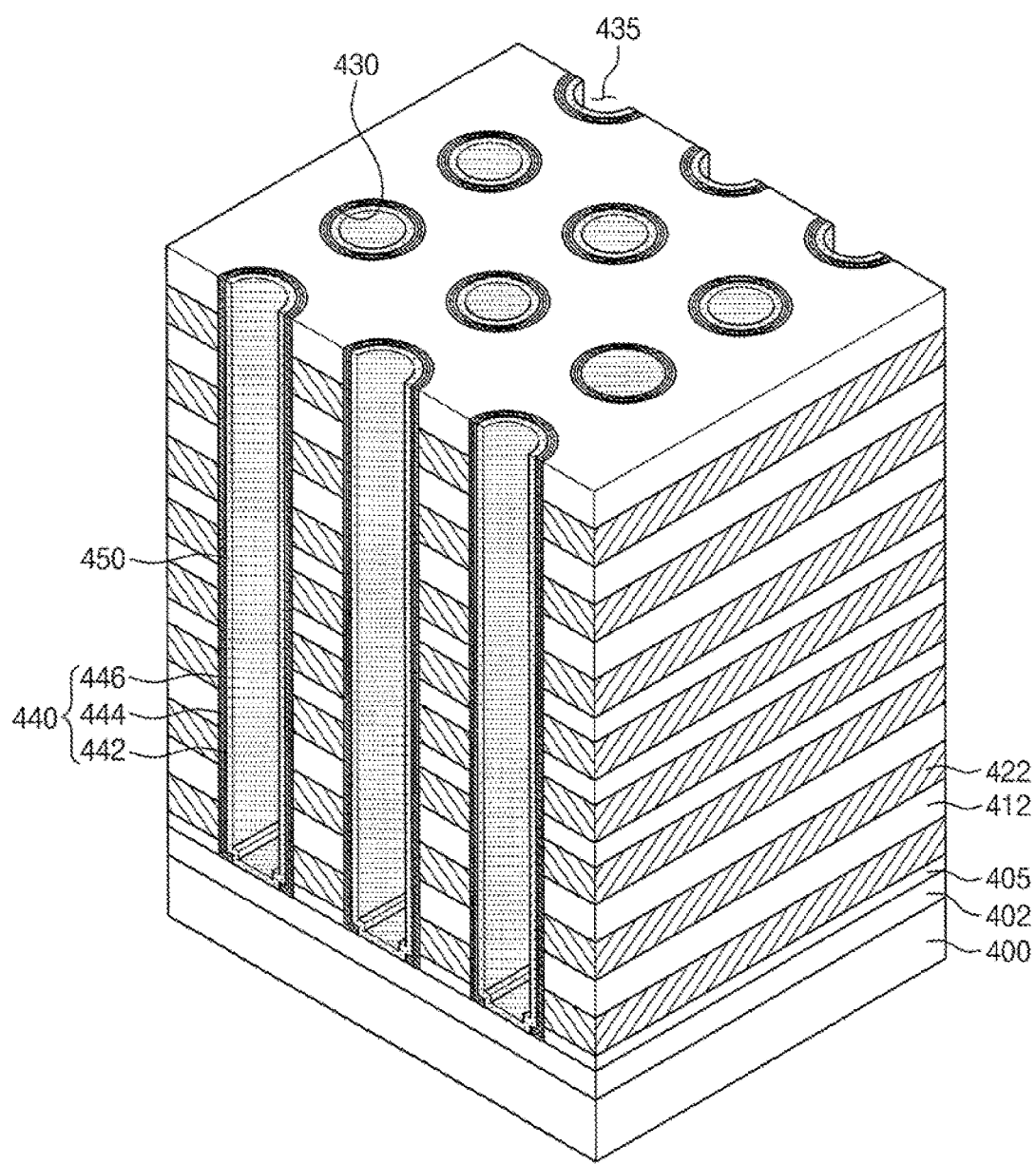

Referring to FIG. 10D, a semiconductor layer may be formed to cover the through regions 430. A portion of the semiconductor layer outside the through regions 430 may be removed to form a semiconductor pattern 450 in each of the through regions 430. The semiconductor pattern 450 may be formed to define a gap region 435 in each of the through regions 430. The semiconductor pattern 450 may be used as a channel region of the semiconductor memory device as described below.

Figure 10E:
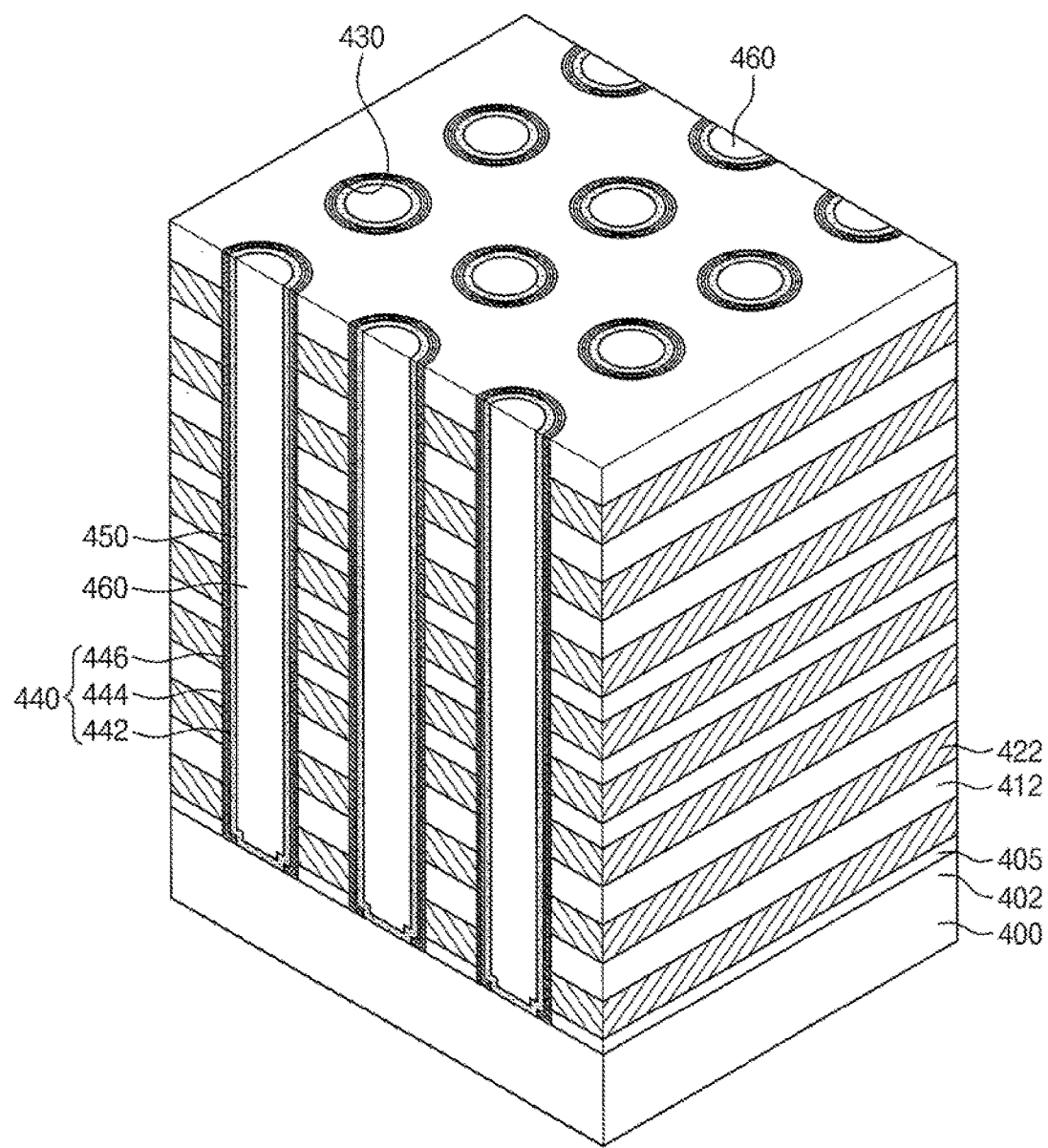

Referring to FIG. 10E, a filling layer 460 may be formed in the through region 430. The filling layer 460 may be formed to fill the gap region 435. An insulating layer filling the gap region 435 may be formed and then a planarization process may be performed on the insulating layer to form the filling layer 460. According to an embodiment, before the semiconductor patterns 450 are formed, the insulating layer filling the gap region 435 may be formed on the semiconductor layer, and then the insulating layer and the semiconductor layer may be subsequently planarized to form the filling layer 460 and the semiconductor pattern 450. Alternatively, the semiconductor layer may be formed to fill the through region 430, so that the filling layer 460 may not be formed.

Figure 10F:
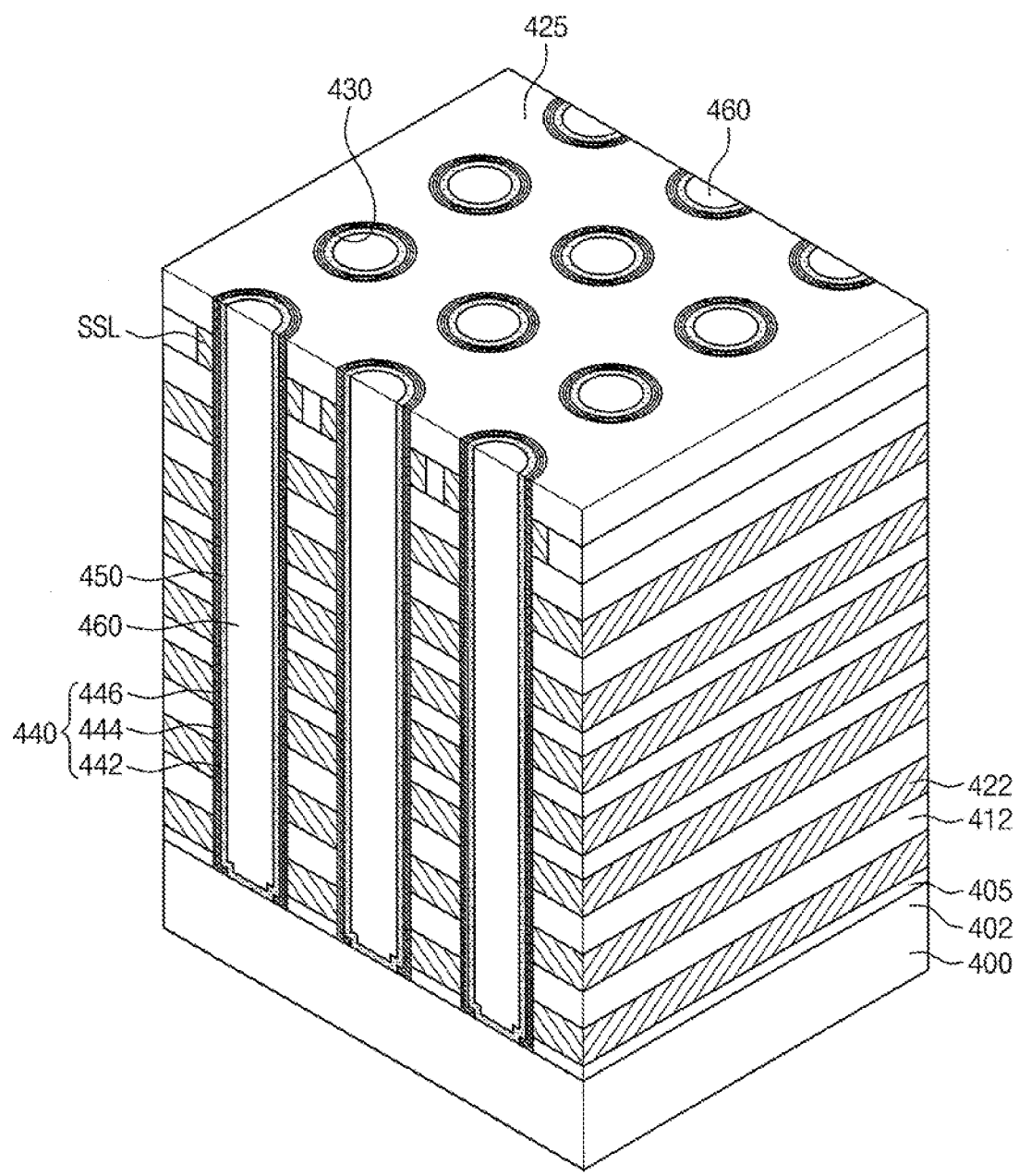

Referring to FIG. 10F, an uppermost gate pattern may be patterned to form string select lines SSL. The string select line SSL may extend in a direction crossing the semiconductor pattern 450. After the string select lines SSL are formed, an insulating layer may be formed between the string select lines SSL.

Figure 10G:
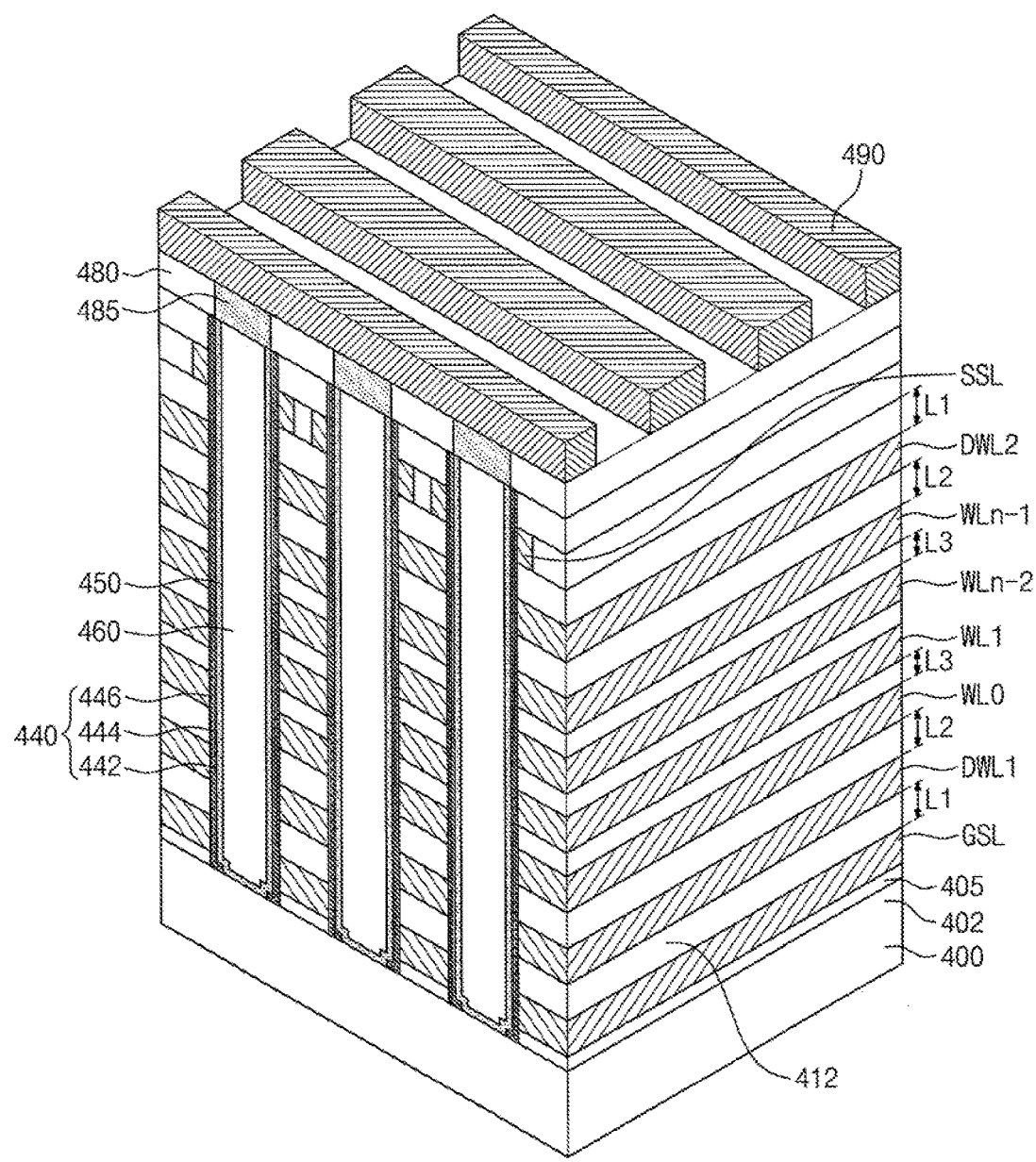

Referring to FIG. 10G, an upper interlayer insulating layer 480 may be formed to cover the semiconductor patterns 450. Contact plugs 485 may be formed in the upper interlayer insulating layer 480 to be electrically connected to the semiconductor patterns 450, respectively. Bit lines 490 may be formed to be electrically connected to the contact plugs 485. The bit lines 490 may cross the string select lines SSL.

The gate patterns may include a plurality of word lines WL0 to WLn−1, a ground select line GSL under the word lines WL0 to WLn−1, a string select line SSL on the word lines WL0 to WLn−1, a first dummy word line DWL1 between the ground select line GSL and the word line WL0 which is a word line nearest to the ground select line GSL, among the word lines WL0 to WLn−1, and a second dummy word line DWL2 between the string select line SSL and the word line WLn−1 which is a word line nearest to the string select line SSL among the word lines WL0 to WLn−1. Each of the first distance L1 between the ground select line GSL and the first dummy word line DWL1 or between the string select line SSL and the second dummy word line DWL2 and the second distance L2 between the first dummy word line DWL1 and the word line WL0 or between the second dummy word line DWL2 and the word line WLn−1 is greater than a third distance L3 between a pair of the word lines adjacent to each other among the word lines WL0 to WLn−1.

Figure 11:
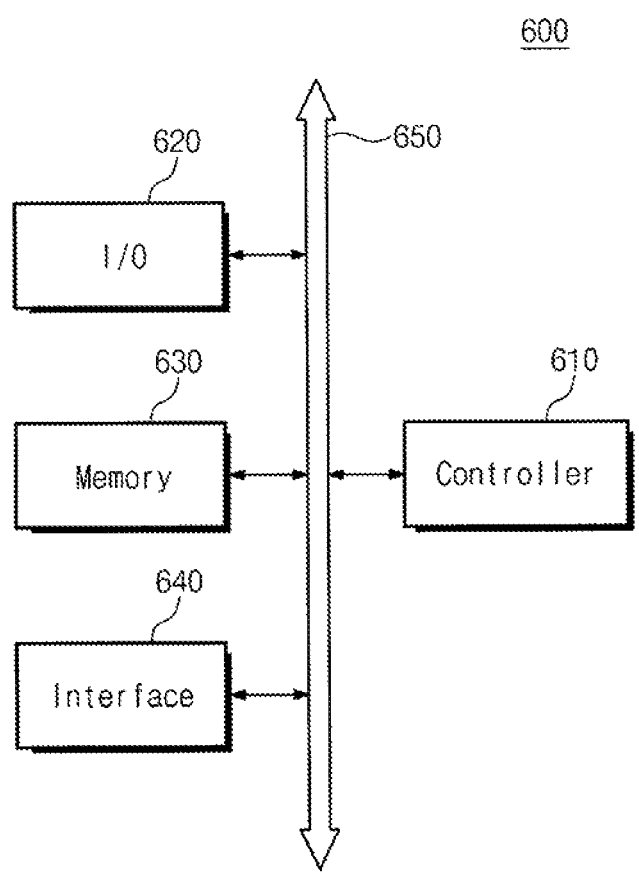
FIG. 11 is a schematic block diagram illustrating an example of memory systems including nonvolatile memory devices according to an embodiment of the inventive concept.

FIG. 11 is a schematic block diagram illustrating an example of a memory system including a nonvolatile memory device according to an embodiment of the inventive concept.

Referring to FIG. 11, a memory system 600 may be applied to a personal digital assistant (PDA), a portable computer, a web tablet, a wireless phone, a mobile phone, a digital music player, a memory card, or other electronic products. The other electronic products may receive or transmit information data by wireless.

The memory system 600 may include a controller 610, an input/output (I/O) unit 620, a memory device 630, an interface unit 640, and a data bus 650. The memory device 630 and the interface unit 640 may communicate with each other through the data bus 650.

The controller 610 may include at least one of a microprocessor, a digital signal processor, a microcontroller, or other logic devices. The other logic devices may have a similar function to any one of the microprocessor, the digital signal processor, and the microcontroller. The memory device 630 may store data and/or commands. The I/O unit 620 may receive data or signals from the outside of the memory system 600 or transmit data or signals to the outside. For example, the I/O unit 620 may include a keypad, a keyboard, and/or a display unit.

The memory device 630 may include a nonvolatile memory device according to an embodiment of the inventive concept. The memory device 630 may further include random access volatile memories and/or other types of semiconductor memory devices. The interface unit 640 may transmit electrical data to a communication network or may receive electrical data from a communication network.

Figure 12:
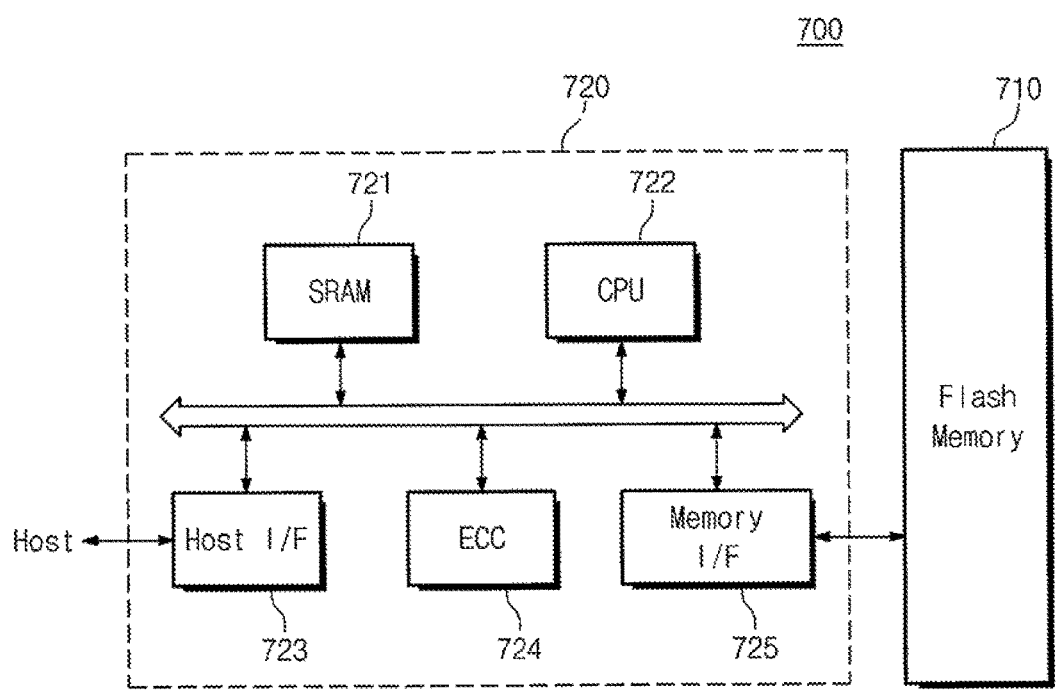
FIG. 12 is a schematic block diagram illustrating an example of memory cards including nonvolatile memory devices according to an embodiment of the inventive concept.

FIG. 12 is a schematic block diagram illustrating an example of a memory card including a nonvolatile memory device according to an embodiment of the inventive concept.

Referring to FIG. 12, a memory card 700 for mass data storage may include a flash memory device 710 according to an embodiment of the inventive concept. The memory card 700 according to an embodiment of the inventive concept may include a memory controller 720 that controls data communication between a host and the memory device 710. An SRAM device 721 may be used as an operation memory of a central processing unit (CPU) 722. A host interface unit 723 may be configured to include a data communication protocol between the memory card 700 and the host. An error check and correction (ECC) block 724 may detect and correct errors of data which are read out from the multi-bit flash memory device 710. A memory interface unit 725 may interface with the flash memory device 710. The CPU 722 controls the overall operation for data exchange of the memory controller 720. Even though not shown in the drawings, the memory card 700 may further include a read only memory (ROM) device that stores code data to interface with the host.

Figure 13:
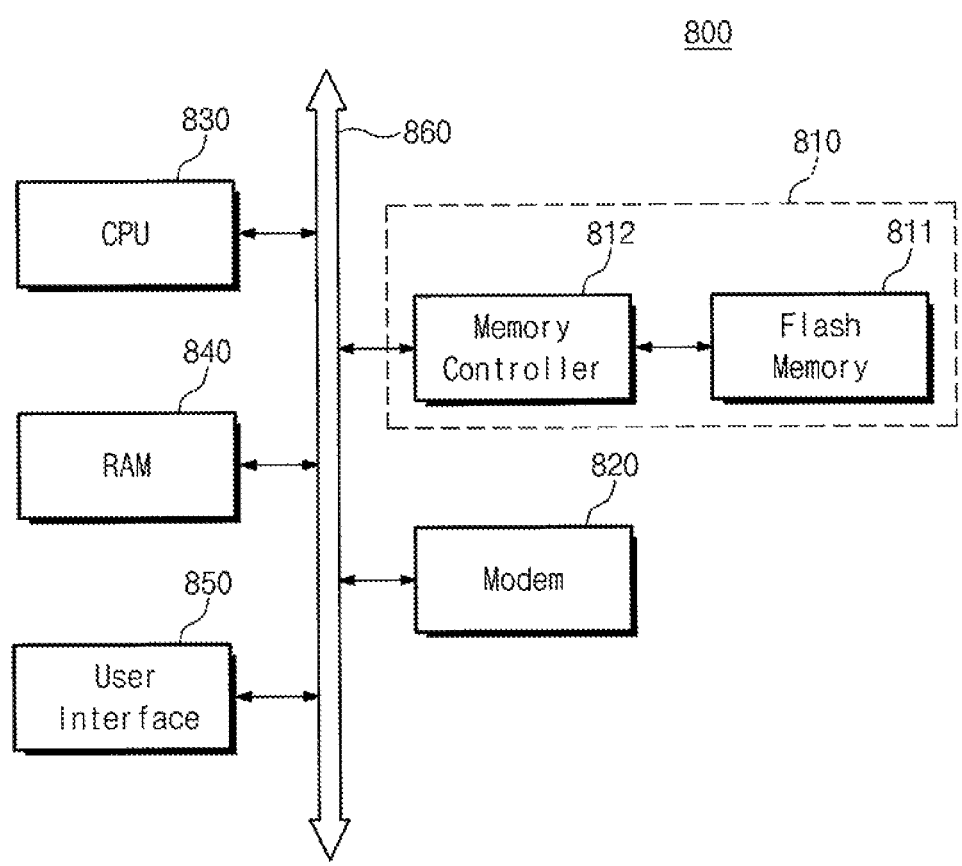
FIG. 13 is a schematic block diagram illustrating an example of information processing systems including nonvolatile memory devices according to an embodiment of the inventive concept.

FIG. 13 is a schematic block diagram illustrating an example of an information processing system including a nonvolatile memory device according to an embodiment of the inventive concept.

Referring to FIG. 13, an information processing system, such as a mobile device or a task top computer, may include a flash memory system 810 according to an embodiment of the inventive concept. The information processing system 800 may include a modem 820 electrically connected to the flash memory system 810 and a system bus 860, a CPU 830, a ram 840, and an user interface 850. The flash memory system 810 may include a flash memory 811 and a memory controller 812 controlling the flash memory 811. The flash memory system 810 may include substantially the same elements as the elements of the memory system or the flash memory system described above. Data processed by the CPU 830 or inputted from the outside may be stored in the flash memory system 810. The flash memory system 810 may constitute a solid state drive (SSD). According to an embodiment, the information processing system 800 may stably store mass data in the flash memory system 810. As reliability increases, resources of the flash memory system 810 for error correction may be decreased, thereby providing a faster data exchange function to the information processing system 800. Even though not shown in the drawings, the information processing system 800 may further include an application chipset, a camera image processer (CIS), and/or an input/out unit.

The nonvolatile memory devices or the memory system according to the embodiments of the inventive concept may be encapsulated using various packaging techniques. For example, the nonvolatile memory devices or the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP)

technique, a wafer-level fabricated package (WFP) technique and a wafer-level processed stack package (WSP) technique.

According to the embodiments of the inventive concept, distances between the dummy word line, the word lines, the ground select line, and the string select line can be controlled. Thus, a program disturbance phenomenon may be minimized and a cell current may be secured.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A nonvolatile memory device comprising:
    a substrate;
    a ground select line on the substrate;
    a plurality of word lines vertically stacked on the ground select line;
    a string select line on the plurality of word lines;
    a first dummy word line between the ground select line and a first word line, wherein the first word line is nearest to the ground select line among the plurality of word lines; and
    a second dummy word line between the string select line and a second word line, wherein the second word line is nearest to the string select line among the plurality of word lines,
    wherein a first distance between a bottom surface of the ground select line and a bottom surface of the first dummy word line is greater than a second distance between the bottom surface of the first dummy word line and a bottom surface of the first word line,
    wherein a third distance between bottom surfaces of adjacent ones of the plurality of word lines is less than the second distance, and
    wherein the ground select line, the first dummy word line, the plurality of word lines, the second dummy word line and the string select line have the same thickness.

2. The nonvolatile memory device of claim 1,
    wherein a bottom surface of the second dummy word line is vertically spaced apart from a bottom surface of the second word line by a fourth distance, and
    wherein the fourth distance is greater than the third distance and is less than the first distance.

3. The nonvolatile memory device of claim 1,
    wherein a bottom surface of the string select line is vertically spaced apart from a bottom surface of the second dummy word line by a fifth distance, and
    wherein the fifth distance is greater than the second distance and the third distance.

4. The nonvolatile memory device of claim 1, wherein each of the ground and string select lines has the same thickness as a thickness of each of the plurality of word lines.

5. The nonvolatile memory device of claim 1, wherein each of the first and second dummy word lines has the same thickness as a thickness of each of the plurality of word lines.

6. The nonvolatile memory device of claim 1, further comprising:
    a semiconductor pattern disposed on sidewalls of the ground select line, the first dummy word line, the plurality of word lines, the second dummy word line, and the string select line; and
    a data storage layer disposed between the semiconductor pattern and the ground select line, the first dummy word line, the plurality of word lines, the second dummy word line, and the string select line.

7. The nonvolatile memory device of claim 6, wherein the data storage layer extends onto top surfaces and bottom surfaces of the ground select line, the first dummy word line, the plurality of word lines, the second dummy word line, and the string select line.

8. The nonvolatile memory device of claim 6, wherein the data storage layer includes a charge trapping layer.

9. A nonvolatile memory device comprising:
    a substrate; and
    first to fourth gate patterns sequentially stacked in a first direction perpendicular to a top surface of the substrate,
    wherein a first distance between a bottom surface of the first gate pattern and a bottom surface of the second gate pattern is greater than a second distance between the bottom surface of the second gate pattern and a bottom surface of the third gate pattern,
    wherein a third distance between the bottom surface of the third gate pattern and a bottom surface of the fourth gate pattern is less than the second distance, and
    wherein the first to fourth gate patterns have the same thickness.

10. The nonvolatile memory device of claim 9, further comprising a plurality of fifth gate patterns stacked on the fourth gate pattern,
    wherein a bottommost one of the plurality of fifth gate patterns is spaced apart from the fourth gate pattern by the third distance in the first direction, and
    wherein each of the plurality of fifth gate patterns are spaced apart from immediately neighboring ones of the plurality of fifth gate patterns by the third distance in the first direction.

11. The nonvolatile memory device of claim 9, further comprising:
    semiconductor patterns penetrating the first to fourth gate patterns in the first direction; and
    a data storage layer disposed between the semiconductor patterns and the first to fourth gate patterns.

12. The nonvolatile memory device of claim 11, wherein the data storage layer includes a charge trapping layer.

13. The nonvolatile memory device of claim 11, wherein the data storage layer extends onto top surfaces and bottom surfaces of the first to fourth gate patterns.

* * * * *